US011830539B2

(12) United States Patent
Kim et al.

(10) Patent No.: US 11,830,539 B2
(45) Date of Patent: Nov. 28, 2023

(54) INTEGRATED CIRCUIT DEVICE INCLUDING A WORD LINE DRIVING CIRCUIT

(71) Applicant: SAMSUNG ELECTRONICS CO., LTD., Suwon-si (KR)

(72) Inventors: Junsoo Kim, Seongnam-si (KR); Minwoo Kwon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/935,121

(22) Filed: Sep. 25, 2022

(65) Prior Publication Data

US 2023/0014583 A1    Jan. 19, 2023

Related U.S. Application Data

(63) Continuation of application No. 17/470,641, filed on Sep. 9, 2021, now Pat. No. 11,482,277.

(30) Foreign Application Priority Data

Nov. 4, 2020   (KR) ........................ 10-2020-0146319

(51) Int. Cl.
  *G11C 11/24*   (2006.01)
  *G11C 11/408*   (2006.01)
  *H10B 12/00*   (2023.01)
(52) U.S. Cl.
  CPC .......... *G11C 11/4085* (2013.01); *H10B 12/30* (2023.02); *H10B 12/50* (2023.02)
(58) Field of Classification Search
  CPC ...... G11C 11/4085; H10B 12/30; H10B 12/50

USPC .......................................................... 365/149
See application file for complete search history.

(56) References Cited

U.S. PATENT DOCUMENTS

| 6,011,746 | A | 1/2000 | Oh |
| 6,069,838 | A * | 5/2000 | Jeong ....................... G11C 8/14 |
| | | | 365/230.06 |
| 6,452,858 | B1 | 9/2002 | Hanzawa et al. |
| 6,504,201 | B1 | 1/2003 | Noble et al. |
| 6,610,576 | B2 | 8/2003 | Nowak |
| 6,898,141 | B2 | 5/2005 | Tsukada |

(Continued)

FOREIGN PATENT DOCUMENTS

| KR | 10-2012-0132264 | 12/2012 |
| TW | 201135921 | 10/2011 |
| TW | 201140586 | 11/2011 |

*Primary Examiner* — Viet Q Nguyen
(74) *Attorney, Agent, or Firm* — F. CHAU & ASSOCIATES, LLC

(57) ABSTRACT

An integrated circuit device includes a plurality of memory cells each including a channel region, a first sub-word line, a second sub-word line, and a storage element. A word line driving circuit is configured to drive the first and sub-word lines. The word line driving circuit includes a PMOS transistor, an NMOS transistor, a keeping NMOS transistor, and a first keeping PMOS transistor. A negative voltage is applied to a source of the NMOS transistor, the negative voltage is applied to a source of the keeping NMOS transistor, the first sub-word line is connected to a source of the first keeping PMOS transistor, the second sub-word line is connected to a drain of the first keeping PMOS transistor, and a negative voltage is applied to a gate of the first keeping PMOS transistor.

20 Claims, 24 Drawing Sheets

(56) References Cited

U.S. PATENT DOCUMENTS

| | | | |
|---|---|---|---|
| 8,223,682 | B2 | 7/2012 | Mazure et al. |
| 8,300,480 | B2 | 10/2012 | Furutani |
| 8,379,476 | B2 | 2/2013 | Lee et al. |
| 8,565,036 | B2 | 10/2013 | Kitayama |
| 8,884,340 | B2 * | 11/2014 | Kim .................. H01L 29/41741 257/270 |
| 9,076,543 | B2 | 7/2015 | Carman |
| 9,449,677 | B2 | 9/2016 | Kim et al. |
| 9,461,053 | B2 * | 10/2016 | Saino .................. H01L 27/0207 |
| 9,559,216 | B2 | 1/2017 | Banna et al. |
| 10,181,341 | B1 | 1/2019 | Sakui |
| 11,482,277 | B2 * | 10/2022 | Kim ..................... G11C 11/404 |
| 2010/0061175 | A1 | 3/2010 | Kim |
| 2010/0157716 | A1 | 6/2010 | Lee |
| 2012/0025874 | A1 | 2/2012 | Saikaku et al. |
| 2014/0246725 | A1 | 9/2014 | Lee et al. |
| 2015/0179243 | A1 | 6/2015 | Chi |
| 2015/0255514 | A1 | 9/2015 | Nakai et al. |
| 2018/0247942 | A1 | 8/2018 | Juengling |
| 2022/0139443 | A1 | 5/2022 | Kim et al. |

* cited by examiner

A3 – A3'

INTEGRATED CIRCUIT DEVICE INCLUDING A WORD LINE DRIVING CIRCUIT

CROSS-REFERENCE TO RELATED APPLICATION

This application is a Continuation of co-pending U.S. patent application Ser. No. 17/470,641, filed on Sep. 9, 2021, which claims priority under 35 U.S.C. § 119 to Korean Patent Application No. 10-2020-0146319, filed on Nov. 4, 2020, in the Korean Intellectual Property Office, the disclosures of which are incorporated by reference herein in their entirety.

TECHNICAL FIELD

The present disclosure relates to an integrated circuit device, and more particularly, to an integrated circuit device including a word line driving circuit.

DISCUSSION OF THE RELATED ART

As electronic products become smaller, perform multiple functions, and have high performance, high-capacity integrated circuit devices have been utilized. As a feature size of a memory device, such as a dynamic random-access memory (DRAM) device, decreases, a gap between a gate electrode and a drain region of each of the constituent transistors that drive the memory device decreases. This decreased gap may give rise to a gate induced drain leakage (GIDL) current.

SUMMARY

An integrated circuit device includes a plurality of memory cells each including a channel region, a first sub-word line, a second sub-word line, and a storage element. A word line driving circuit is configured to drive the first sub-word line and the second sub-word line of each of the plurality of memory cells. The word line driving circuit includes a P-channel metal oxide semiconductor (PMOS) transistor, wherein a first word line driving signal is applied to a source of the PMOS transistor. A sub-word line enable signal is applied to a gate of the PMOS transistor. The first sub-word line is connected to a drain of the PMOS transistor. A negative voltage is applied to a source of an N-channel metal oxide semiconductor (NMOS) transistor. The sub-word line enable signal is applied to a gate of the NMOS transistor. The first sub-word line is connected to a drain of the NMOS transistor. A second word line driving signal is applied to a gate of a keeping NMOS transistor. The negative voltage is applied to a source of the keeping NMOS transistor. The first sub-word line is connected to a drain of the keeping NMOS transistor. The first sub-word line is connected to a source of a first keeping PMOS transistor. The second sub-word line is connected to a drain of the first keeping PMOS transistor. The negative voltage is applied to a gate of the first keeping PMOS transistor.

An integrated circuit device includes a plurality of memory cells each including a channel region, a first sub-word line, a second sub-word line, and a storage element. A word line driving circuit is configured to apply a first voltage to the first sub-word line and the second sub-word line each connected to a selected memory cell, apply a second voltage to the first sub-word line of an unselected memory cell, and apply a third voltage to the second sub-word line of the unselected memory cell, in response to a sub-word line enable signal, a first word line driving signal, and a second word line driving signal. The word line driving circuit includes a PMOS transistor in which the first word line driving signal is applied to a source of the PMOS transistor, the sub-word line enable signal is applied to a gate of the PMOS transistor, and the first sub-word line is connected to a drain of the PMOS transistor. The second voltage is applied to a source of an NMOS transistor, the sub-word line enable signal is applied to a gate of the NMOS transistor, and the first sub-word line is connected to a drain of the NMOS transistor. The second word line driving signal is applied to a gate of a keeping NMOS transistor. The second voltage is applied to a source of the keeping NMOS transistor. The first sub-word line is connected to a drain of the keeping NMOS transistor. The first sub-word line is connected to a source of a first keeping PMOS transistor, the second sub-word line is connected to a drain of the first keeping PMOS transistor, and a negative voltage is applied to a gate of the first keeping PMOS transistor.

An integrated circuit device includes a plurality of memory cells disposed on a substrate. Each of the plurality of memory cells includes a semiconductor pattern extending in a first horizontal direction that is parallel to a top surface of the substrate and including a first source/drain region, the channel region, and a second source/drain region. A bit line is disposed adjacent to the first source/drain region of the semiconductor pattern and extends in a second horizontal direction that is parallel to the top surface of the substrate. A first sub-word line is disposed adjacent to the channel region of the semiconductor pattern, is spaced apart from the bit line by a first distance, and extends in a vertical direction that is perpendicular to the top surface of the substrate. A second sub-word line is disposed adjacent to the channel region of the semiconductor pattern, is spaced apart from the bit line by a second distance that is greater than the first distance, and extends in the vertical direction. A word line driving circuit is configured to apply a first voltage to the first sub-word line and the second sub-word line, each connected to a selected memory cell, apply a second voltage to the first sub-word line of an unselected memory cell, and apply a third voltage to the second sub-word line of the unselected memory cell, in response to a sub-word line enable signal, a first word line driving signal, and a second word line driving signal. The first voltage is set to a boosted voltage that is higher than a power supply voltage, the second voltage is set to a negative voltage that is lower than a ground voltage, and the third voltage is set to a buffer voltage that is higher than the ground voltage and lower than the power supply voltage.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, example embodiments of the inventive concepts are described in detail in conjunction with the accompanying drawings.

Figure 1:
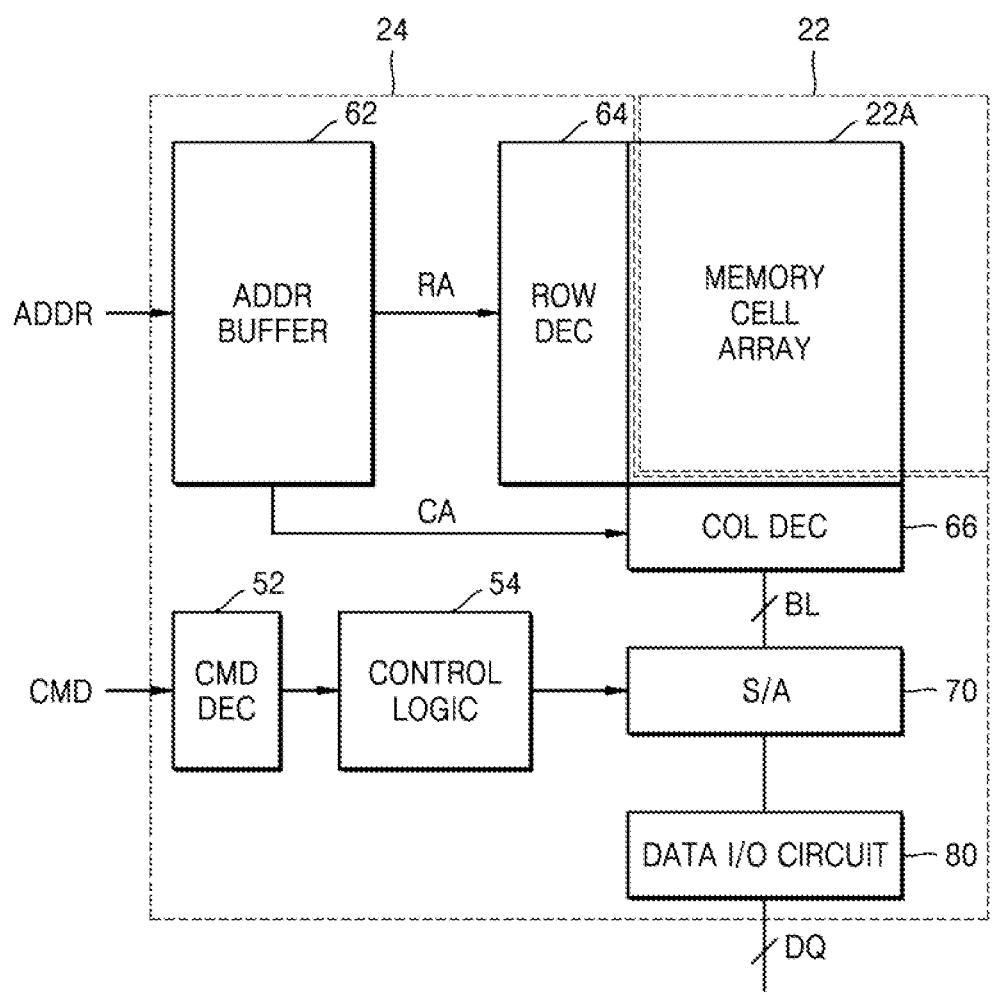
FIG. 1 is a block diagram illustrating an example of an integrated circuit device according to an example embodiment of the present disclosure.

FIG. 1 is a block diagram illustrating an example configuration of an integrated circuit device 10 according to an example embodiment of the present disclosure.

Referring to FIG. 1, the integrated circuit device 10 includes a first region 22 and a second region 24. The integrated circuit device 10 may further include a storage device that may be a semiconductor storage device. For example, the integrated circuit device 10 may include a volatile memory such as dynamic random-access memory (RAM) (DRAM), synchronous DRAM (SDRAM), double data rate (DDR) SDRAM (DDR SDRAM), low power double data rate SDRAM (LPDDR SDRAM), graphics DDR (GDDR) synchronous DRAM (SDRAM) (GDDR SDRSM), DDR3 SDRAM, DDR4 SDRAM, and/or thyristor RAM (TRAM), or a non-volatile memory such as phase change RAM (PRAM), magnetic RAM (MRAM), and/or resistive RAM (RRAM).

In some embodiment of the present disclosure, the first region 22 may include a memory cell area of a DRAM device, and the second region 24 may include a peripheral circuit area of the DRAM device. The first region 22 may include a memory cell array 22A.

The second region 24 may output data via data lines DQ in response to a command CMD, an address ADDR, and control signals that are received from an external device, for example, a memory controller. The integrated circuit device 10 further includes a command decoder 52, a control logic 54, an address buffer 62, a row decoder 64, a column decoder 66, a sense amplifier 70, and a data input/output circuit 80.

The memory cell array 22A includes a plurality of memory cells MC provided in a matrix that is arranged in a plurality of rows and columns. The memory cell array 22A includes a plurality of first sub-word lines WLX1, WLX2, ..., and WLXn: WLX (see FIG. 3), a plurality of second sub-word lines WLY1, WLY2, ..., and WLYn: WLY (see FIG. 3), and a plurality of bit lines BL1, BL2, ..., and BLn: BL (see FIG. 3), which are connected to the memory cells MC (see FIG. 3). The plurality of first sub-word lines WLX and the plurality of second sub-word lines WLY may be connected to the rows of the memory cells, and the plurality of bit lines BL may be connected to the columns of the memory cells MC.

The command decoder 52 may decode a write enable signal/WE, a row address strobe signal/RAS, a column address strobe signal/CAS, a chip select signal/CS, and the like that are received from an external device, for example, the memory controller, so that control signals corresponding to the command CMD are generated by the control logic 54. The command CMD may include an active command, a read command, a write command, a precharge command, and the like.

The address buffer 62 receives the address ADDR from the memory controller, which is the external device. The address ADDR includes a row address RA addressing the rows of the memory cell array 22A and a column address CA addressing the columns of the memory cell array 22A. The address buffer 62 may provide the row address RA to the row decoder 64 and the column address CA to the column decoder 66.

The row decoder 64 may select any one of the plurality of word lines WL connected to the memory cell array 22A. The row decoder 64 may decode the row address RA received from the address buffer 62, select any one word line WL corresponding to the row address RA, and activate the selected word line WL.

The column decoder 66 may select any one bit line BL of the plurality of bit lines BL of the memory cell array 22A. The column decoder 66 may decode the column address CA received from the address buffer 62, and select a certain bit line BL corresponding to the column address CA.

The sense amplifier 70 is connected to the bit lines BL of the memory cell array 22A. The sense amplifier 70 senses a voltage change of the selected bit line of the plurality of bit lines BL, and amplifies and outputs the sensed voltage change. The data input/output circuit 80 may output data based on a voltage sensed and amplified by the sense amplifier 70 externally via the data lines DQ.

Figure 2:
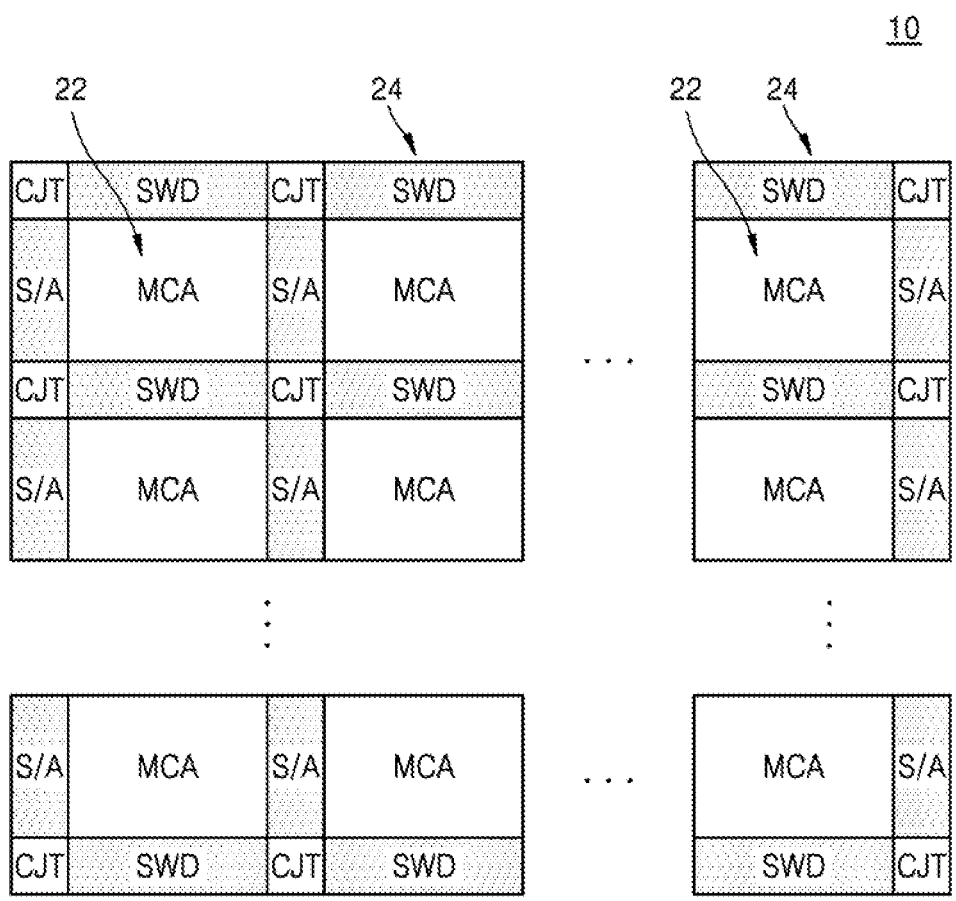
FIG. 2 is a plan view illustrating an example arrangement of an integrated circuit device according to an example embodiment of the present disclosure.
Figure 3:
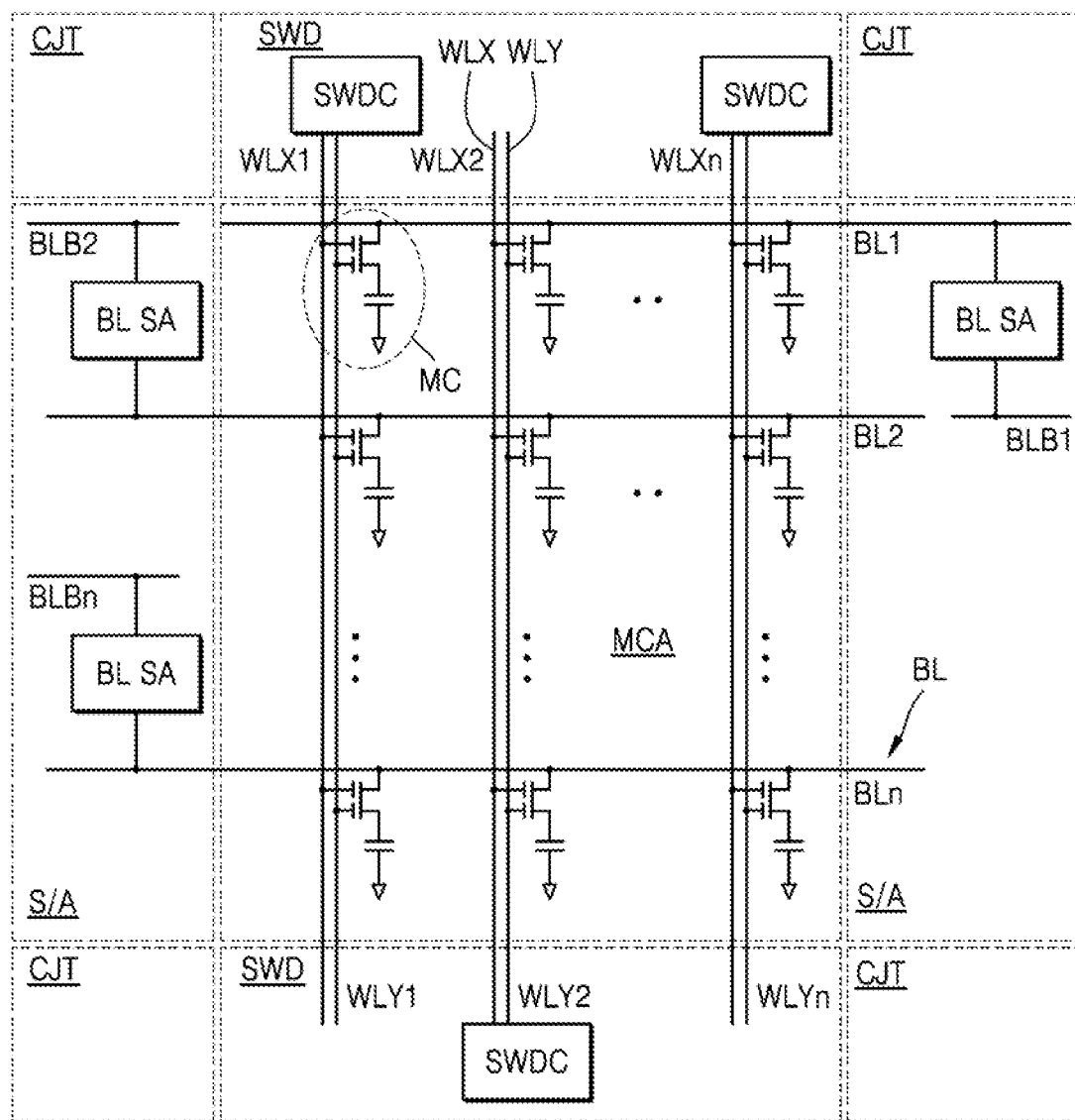
FIG. 3 is a diagram illustrating an example connection between a word line driving circuit and memory cells of FIG. 2.
Figure 4:
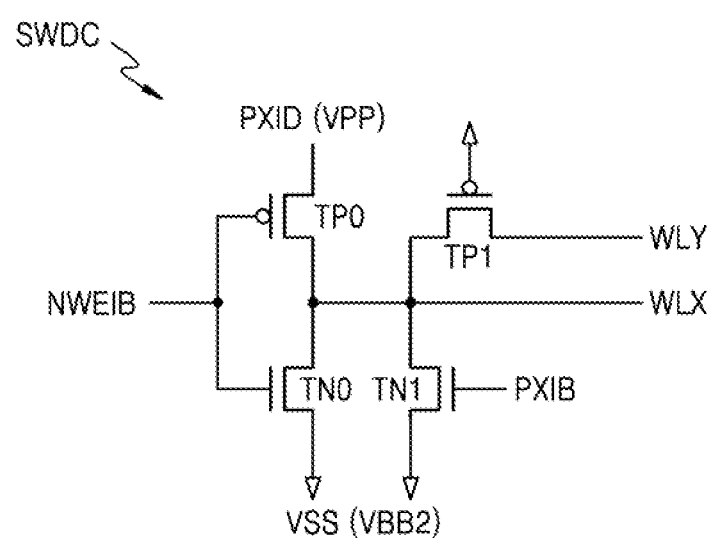
FIG. 4 is a circuit diagram of the word line driving circuit of FIG. 3.

FIG. 2 is a plan view illustrating an example arrangement configuration of an integrated circuit device 10 according to an example embodiment of the present disclosure. FIG. 3 is a diagram illustrating an example connection configuration between a word line driving circuit and memory cells of FIG. 2. FIG. 4 is a circuit diagram of a word line driving circuit SWDC of FIG. 3.

Referring to FIGS. 2 to 4, the integrated circuit device 10 includes a plurality of first regions 22. Each of the plurality of first regions 22 may be at least partially surrounded by a second region 24. In some example embodiments of the present disclosure, each of the plurality of first regions 22 may include a cell array area MCA of a DRAM device, and the second region 24 may include an area and a core area (hereinafter, referred to as a "peripheral circuit area") in which peripheral circuits of the DRAM device are formed.

The second region 24 may include a sub-word line driver block SWD, a sense amplifier block S/A, and a conjunction block CJT.

Word line driving circuits SWDC are disposed in the sub-word line driver block SWD to drive a first sub-word line WLX and a second sub-word line WLY to different voltage levels. Each of the word line driving circuits SWDC is controlled by a sub-word line enable signal NWEIB output from a row decoder 64 (see FIG. 1) and first and second word line driving signals PXID and PXIB. The first and second word line driving signals PXID and PXIB are complementary signals for driving the word line driving circuit SWDC. When a memory cell MC is accessed, a corresponding sub-word line enable signal NWEIB is activated. A corresponding word line driving circuit SWDC applies a boosted voltage VPP to a corresponding first sub-word line WLX and a corresponding second sub-word line WLY in response to the sub-word line enable signal NWEIB. When an access operation of the memory cell MC is completed, the word line driving circuit SWDC precharges the corresponding first sub-word line WLX to a negative voltage VBB and precharges the corresponding second sub-word line WLY to a buffer voltage VPT.

A plurality of sense amplifiers 70 (see FIG. 1) may be disposed in the sense amplifier block S/A. A plurality of bit line sense amplifiers BL SA are disposed in the sense amplifier block S/A, and each of the bit line sense amplifiers BL SA is connected to a bit line BL1, BL2, . . . , or BLn and a complementary bit line BLB1, BLB2, . . . , or BLBn corresponding thereto, which are connected to a memory cell MC corresponding to a column of the memory cell area MCA. The bit line sense amplifier BL SA may amplify data stored in the memory cell MC, for example, may sense a voltage change of a selected bit line BL and amplify and output the sensed voltage change.

The conjunction block CJT may be disposed at a point where the sub-word line driver block SWD and the sense amplifier block S/A intersect each other. Driving signal generation circuits for supplying a high voltage, e.g., a boosted voltage VPP, which is higher than a power supply voltage, to selected first and second sub-word lines WLX and WLY and applying a negative voltage VBB to an unselected first sub-word line WLX may be disposed in the conjunction block CJT. In addition, power drivers and ground drivers for driving the sense amplifier 70 may be alternately disposed in the conjunction block CJT.

A peripheral circuit such as an inverter chain and an input/output circuit may be further formed in the second region 24.

A plurality of memory cells MC disposed in the cell array area MCA may be connected to the first sub-word line WLX and the second sub-word line WLY that are disposed in parallel, and the first sub-word line WLX and the second sub-word line WLY may correspond to two gate electrodes spaced apart from each other and each disposed on channel regions of the memory cells MC. The first sub-word line WLX may be disposed closer to the bit line BL, and the second sub-word line WLY may be disposed closer to a storage node SN (see FIG. 6). When a memory cell MC is selected (for example, when a memory cell transistor MCT (see FIG. 6) is turned on), the same voltage may be applied to the first and second sub-word lines WLX and WLY and thus the first and second sub-word lines WLX and WLY may function as one gate electrode. When the memory cell MC is unselected (for example, when the memory cell transistor MCT is turned off), different voltages may be applied to the first and second sub-word lines WLX and WLY to effectively reduce or suppress a GIDL current due to a floating body effect.

The first sub-word line WLX and the second sub-word line WLY that correspond to one memory cell row are connected to one word line driving circuit SWDC. The boosted voltage VPP is applied from the word line driving circuit SWDC to the first sub-word line WLX of a selected memory cell row, and the boosted voltage VPP is applied from the word line driving circuit SWDC to the second sub-word line WLY of the selected memory cell row. When access to a memory cell row is terminated, the negative voltage VBB is applied from the word line driving circuit SWDC to the first sub-word line WLX of the memory cell row, and the buffer voltage VPT is applied from the word line driving circuit SWDC to the second sub-word line WLY of the memory cell row.

As illustrated in FIG. 4, the word line driving circuit SWDC may include an N-channel metal oxide semiconductor (NMOS) transistor TN0, a P-channel metal oxide semiconductor (PMOS) transistor TP0, a keeping NMOS transistor TN1, and a first keeping PMOS transistor TP1. The first word line driving signal PXID is applied to the source of the PMOS transistor TP0, the sub-word line enable signal NWEIB is applied to the gate of the PMOS transistor TP0, and the first sub-word line WLX is connected to the drain of the PMOS transistor TP0. The negative voltage VBB2 is applied to the source of the NMOS transistor TN0, the sub-word line enable signal NWEIB is applied to the gate of the NMOS transistor TN0, and the first sub-word line WLX is connected to the drain of the NMOS transistor TN0.

The second word line driving signal PXIB is applied to the gate of the keeping NMOS transistor TN1, the negative voltage VBB is applied to the source of the keeping NMOS transistor TN1, and the first sub-word line WLX is connected to the drain of the keeping NMOS transistor TN1. The first sub-word line WLX is connected to the source of the first keeping PMOS transistor TP1, the second sub-word line WLY is connected to the drain of the first keeping PMOS transistor TP1, and the negative voltage VBB2 may be applied to the gate of the first keeping PMOS transistor TP1.

In example embodiments of the present disclosure, the level of the buffer voltage VPT may be lower than the level of the boosted voltage VPP and higher than the level of the negative voltage VBB2. For example, the level of the buffer voltage VPT may be about 0.1 Volts (V) to about 0.5 V. The difference between the level of the buffer voltage VPT and the level of the negative voltage VBB2 may correspond to the threshold voltage level of the first keeping PMOS transistor TP1.

A word line driving circuit SWDC, according to a comparative example, has a structure including the NMOS transistor TN0, the PMOS transistor TP0, and the keeping NMOS transistor TN1, and is configured to apply the boosted voltage VPP to one word line when the memory cell MC is selected and to apply the negative voltage VBB2 to the one word line when the memory cell MC is not selected. Accordingly, an additional voltage generator is installed to apply different voltage levels to the first sub-word line WLX and the second sub-word line WLY when the memory cell MC is not selected. However, in the word line driving circuit SWDC, according to example embodiments of the present disclosure, while the negative voltage VBB2 is applied from the drain terminal of the keeping NMOS transistor TN1, the buffer voltage VPT having a higher level than the negative voltage VBB2 may be applied from the drain terminal of the first keeping PMOS transistor TP1. Accordingly, the word line driving circuit SWDC may apply different voltages to the first sub-word lines WLX and the second sub-word line WLY without installing an additional voltage generator, and thus, the overhead of a peripheral circuit area due to forming the voltage generator may be avoided.

Figure 5:
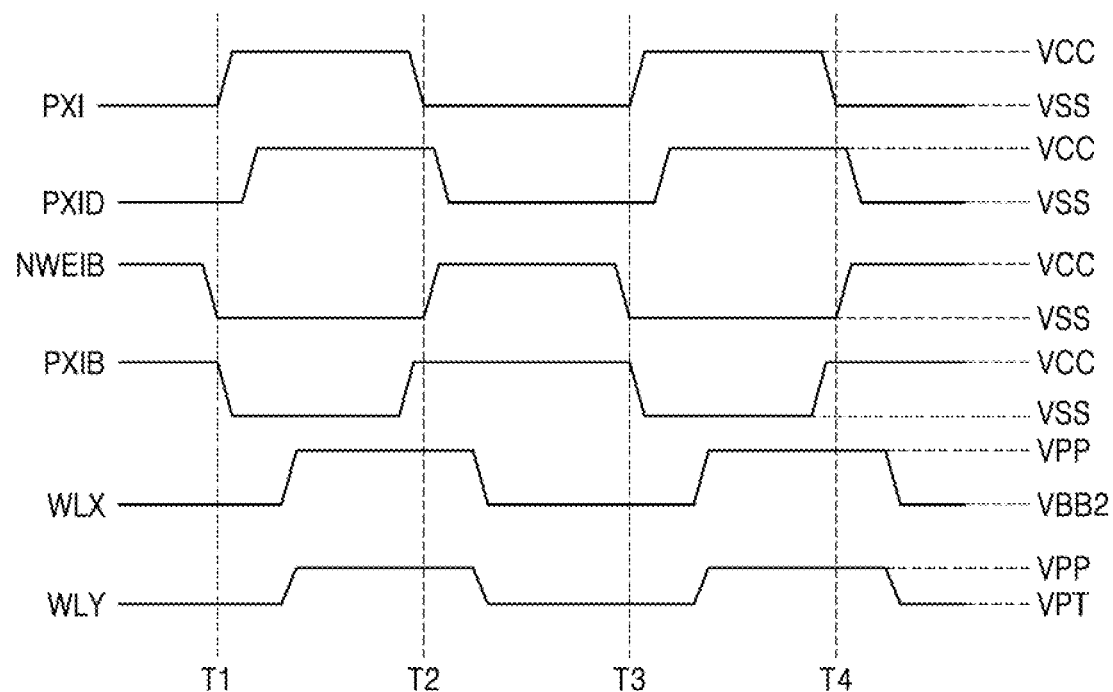
FIG. 5 is a timing diagram illustrating driving of a word line driving circuit according to example embodiments of the present disclosure.

FIG. 5 is a timing diagram illustrating driving of a word line driving circuit according to example embodiments of the present disclosure.

Referring to FIG. 5, the first word line enable signal PXI initially maintains a low level, transitions to a high level VCC at timings T1 and T3 if it is desired to activate a corresponding first sub-word line WLX and a corresponding second sub-word line WLY, and transitions to a low level VSS at timings T2 and T4 if it is desired to activate other word lines.

The first word line driving signal PXID (or a boost node voltage signal) initially maintains a low level, transitions to the level of the boosted voltage VPP when the first word line enable signal PXI transitions to the high level VCC at timings T1 and T3, and transitions to the level of a ground voltage, for example, the low level VSS, when the first word line enable signal PXI transitions to the low level VSS at timings T2 and T4.

The sub-word line enable signal NWEIB initially maintains the high level VCC and disables the corresponding first sub-word line WLX and the corresponding second sub-word line WLY to a negative voltage level. Then, the sub-word line enable signal NWEIB transitions to the low level VSS at timings T1 and T3 if it is desired to activate the corresponding first sub-word line WLX and the corresponding second sub-word line WLY, and transitions to the high level VCC at timings T2 and T4 if it is desired to activate the other word lines.

The second word line driving signal PXIB initially maintains the high level VCC and disables the corresponding first sub-word line WLX and the corresponding second sub-word line WLY to a negative voltage level. Then, the second word line driving signal PXIB transitions to the low level VSS at timings T1 and T3 if it is desired to activate the corresponding first sub-word line WLX and the corresponding second sub-word line WLY, and transitions to the high level VCC at timings T2 and T4 if it is desired to activate the other word lines.

The first sub-word line WLX is initially maintained at a negative level in response to the second word line driving signal PXIB. Then, when the sub-word line enable signal NWEIB transitions to the low level VSS at timings T1 and T3, the first word line driving signal PXID is transmitted to the first sub-word line WLX after a certain time delay has elapsed, and when the sub-word line enable signal NWEIB transitions to the high level VCC at timings T2 and T4 at which the other word lines are activated, the first sub-word line WLX is deactivated to the negative level VBB2 in response to the second word line driving signal PXIB.

The second sub-word line WLY is initially maintained at the level of the buffer voltage VPT in response to the second word line driving signal PXIB. Then, when the sub-word line enable signal NWEIB transitions to the low level VSS at timings T1 and T3, the first word line driving signal PXID is transmitted to the second sub-word line WLY after a certain time delay has elapsed, and when the sub-word line enable signal NWEIB transitions to the high level VCC at timings T2 and T4 at which the other word lines are activated, the second sub-word line WLY is deactivated to the level of the buffer voltage VPT in response to the second word line driving signal PXIB.

In example embodiments of the present disclosure, the level of the buffer voltage VPT may be lower than the level of the boosted voltage VPP and higher than the level of the negative voltage VBB2. For example, the level of the buffer voltage VPT may be about 0.1 V to about 0.5 V. The difference between the level of the buffer voltage VPT and the level of the negative voltage VBB2 may correspond to the threshold voltage level of the first keeping PMOS transistor TP1.

When the first sub-word line WLX is disabled (for example, at timings T2 and T4 at which the other word lines are activated), the negative voltage VBB2 may be applied to the source of the first keeping PMOS transistor TP1, and when the negative voltage VBB2 is applied to the gate of the first keeping PMOS transistor TP1, a voltage between the drain (e.g., a terminal connected to the second sub-word line WLY) and the source of the first keeping PMOS transistor TP1 at a saturation region may be substantially equal to or similar to the threshold voltage of the first keeping PMOS transistor TP1.

Figure 6:
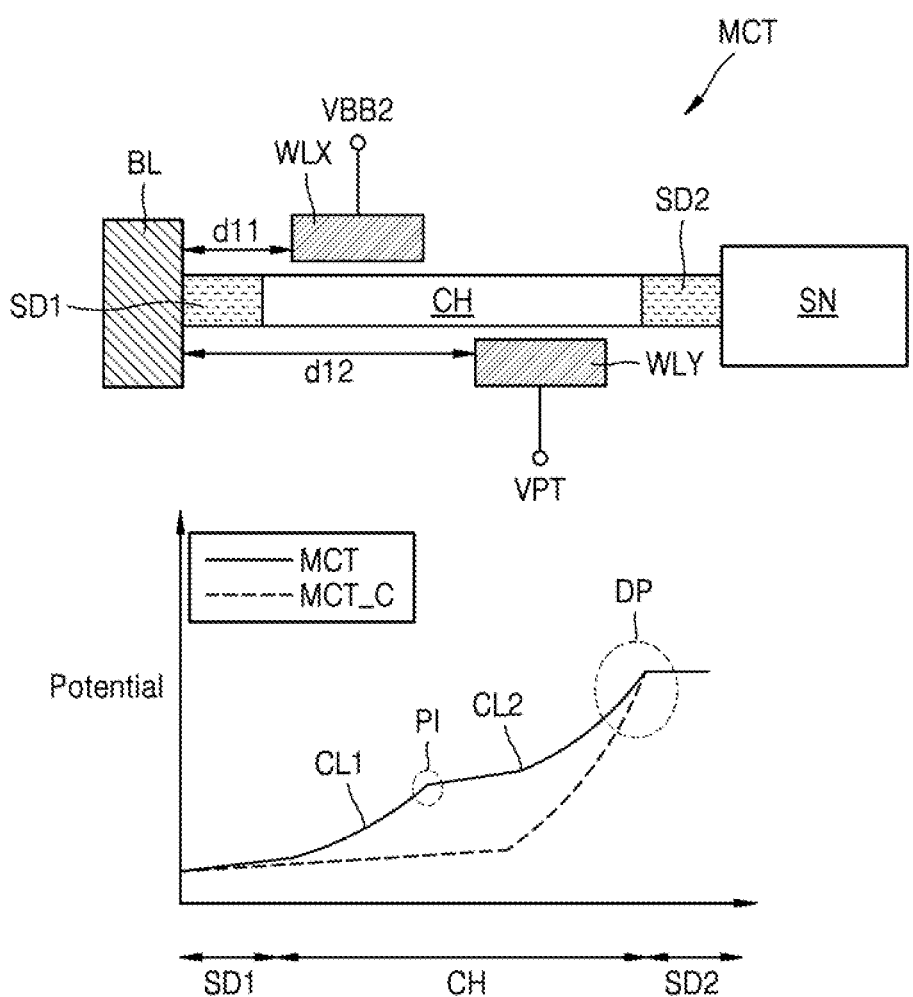
FIG. 6 is a schematic diagram of a memory cell transistor according to example embodiments of the present disclosure, and schematically illustrates an electrical potential of the memory cell transistor in an unselected state.

FIG. 6 is a schematic diagram illustrating a memory cell transistor MCT according to example embodiments of the present disclosure, and FIG. 6 schematically illustrates an electrical potential of the memory cell transistor MCT in an unselected state.

Referring to FIG. 6, the memory cell transistor MCT includes a channel region CH disposed between a first impurity region SD1 and a second impurity region SD2. A bit line BL is disposed adjacent to the first impurity region SD1 and a storage node SN is disposed adjacent to the second impurity region SD2. A first sub-word line WLX is disposed on the channel region CH and is close to a first source/drain region, for example, the first impurity region SD1, and a second sub-word line WLY is disposed on the channel region CH and is close to a second source/drain region, for example, the second impurity region SD2. The first sub-word line WLX is apart from the bit line BL by a first distance d11, and the second sub-word line WLY is apart from the bit line BL by a second distance d12 that is greater than the first distance d11.

When the memory cell transistor MCT is unselected, a negative voltage VBB2 is applied to the first sub-word line WLX from the word line driving circuit SWDC shown in FIG. 5, and a buffer voltage VPT is applied to the second sub-word line WLY. In an example, the negative voltage VBB2 may be about −0.2 V, and the buffer voltage VPT may be about 0.4 V.

As different voltages are applied to the first sub-word line WLX and the second sub-word line WLY, the channel region CH has two curved portions, for example, a first curved portion CL1 and a second curved portion CL2, and an inflection point PI between the two curved portions. For example, the first curved portion CL1 corresponds to a potential of the channel region CH adjacent to the first sub-word line WLX, and indicates a potential gradually increasing as the distance from the bit line BL increases. The second curved portion CL2 corresponds to a potential of the channel region CH adjacent to the second sub-word line WLY, and indicates a potential gradually increasing as the distance from the bit line BL increases. An inflection point PI at which the slope of a potential curve suddenly decreases appears at the boundary between the first curved portion CL1 and the second curved portion CL2. In addition, a potential curve having a relatively small slope is shown at a drain adjacent region DP, which is the boundary between the channel region CH and the second source/drain region SD2.

For comparison, FIG. 6 also shows the potential of a memory cell transistor MCT_C according to a comparative example. The memory cell transistor MCT_C according to the comparative example has a structure in which a single word line is disposed over the entire length of the channel region CH. In the memory cell transistor MCT_C, according to the comparative example, a negative voltage VBB2 is applied to the single word line, and a potential rapidly increases at the drain adjacent portion DP (for example, a potential curve with a large slope is shown). A significant amount of GIDL current may be generated due to a rapid increase in potential in the drain adjacent portion DP.

The memory cell transistor MCT, according to example embodiments of the present disclosure, exhibits a potential curve with a relatively small slope at the drain adjacent region DP compared to the memory cell transistor MCT_C according to the comparative example, and thus, the GIDL current may be significantly reduced in the example embodiments of the present disclosure. Also, as the negative voltage VBB2 is applied to the first sub-word line WLX, the memory cell transistor MCT may have a reduced off current. The integrated circuit device 10 may have excellent electrical performance in the example embodiments of the present disclosure.

In addition, according to the example embodiments of the present disclosure described with reference to FIGS. 1 to 6, one word line driving circuit SWDC may simultaneously provide, to an unselected memory cell row, a negative voltage VBB2 and a buffer voltage VPT having a voltage level different from that of the negative voltage VBB2. Therefore, there is no need to form a separate voltage generator to simultaneously apply a negative voltage VBB2 to the first sub-word line WLX and a buffer voltage VPT having a voltage level different from that of the negative voltage VBB2 to the second sub-word line WLY. Therefore, the overhead of a peripheral circuit area due to forming a separate voltage generator may be prevented.

FIGS. 7 to 11 are schematic diagrams illustrating an integrated circuit device 100 according to example embodiments of the present disclosure.

Figure 7:
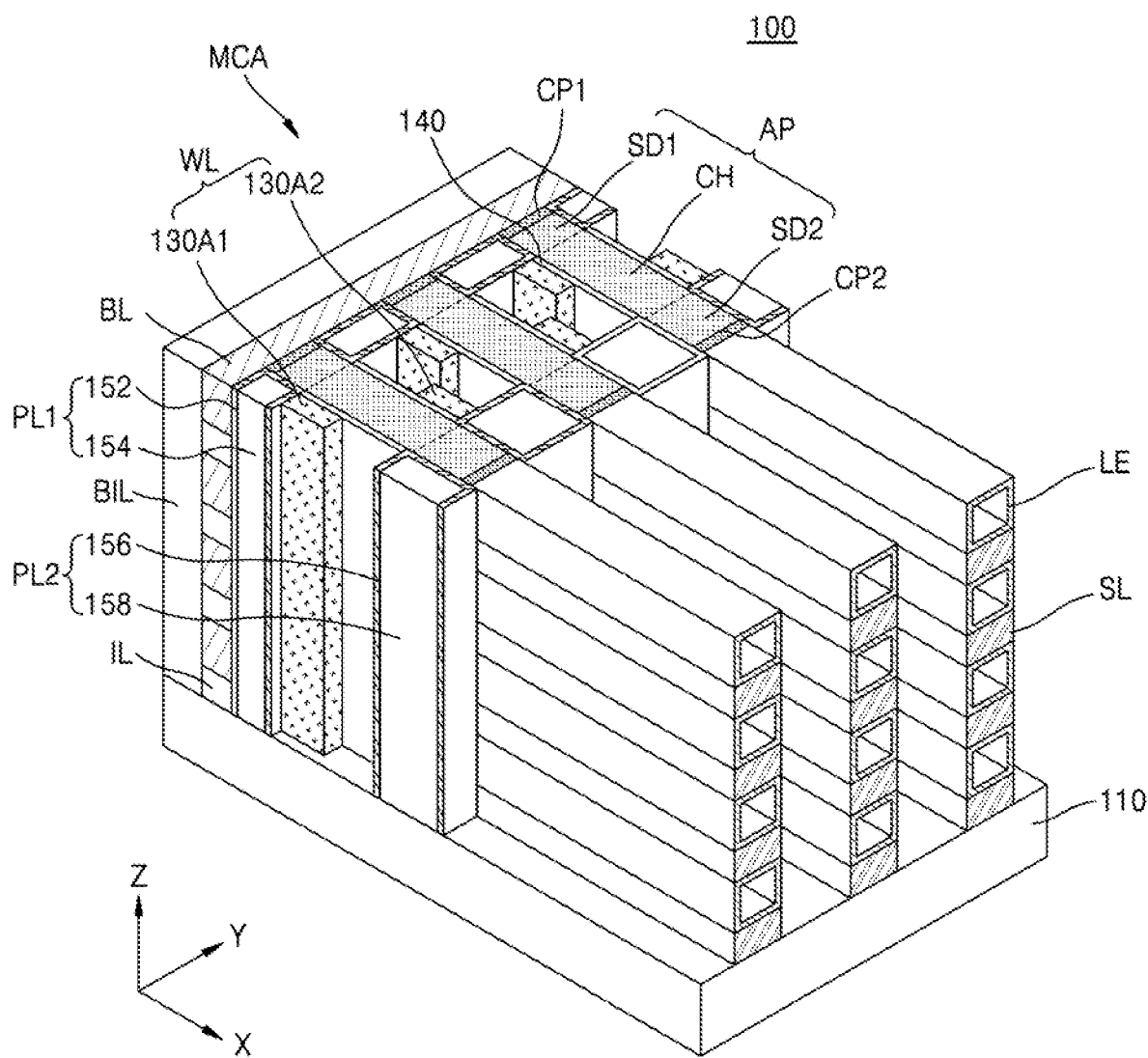
FIG. 7 is a perspective view illustrating a memory cell included in an integrated circuit device according to example embodiments of the present disclosure.
Figure 8:
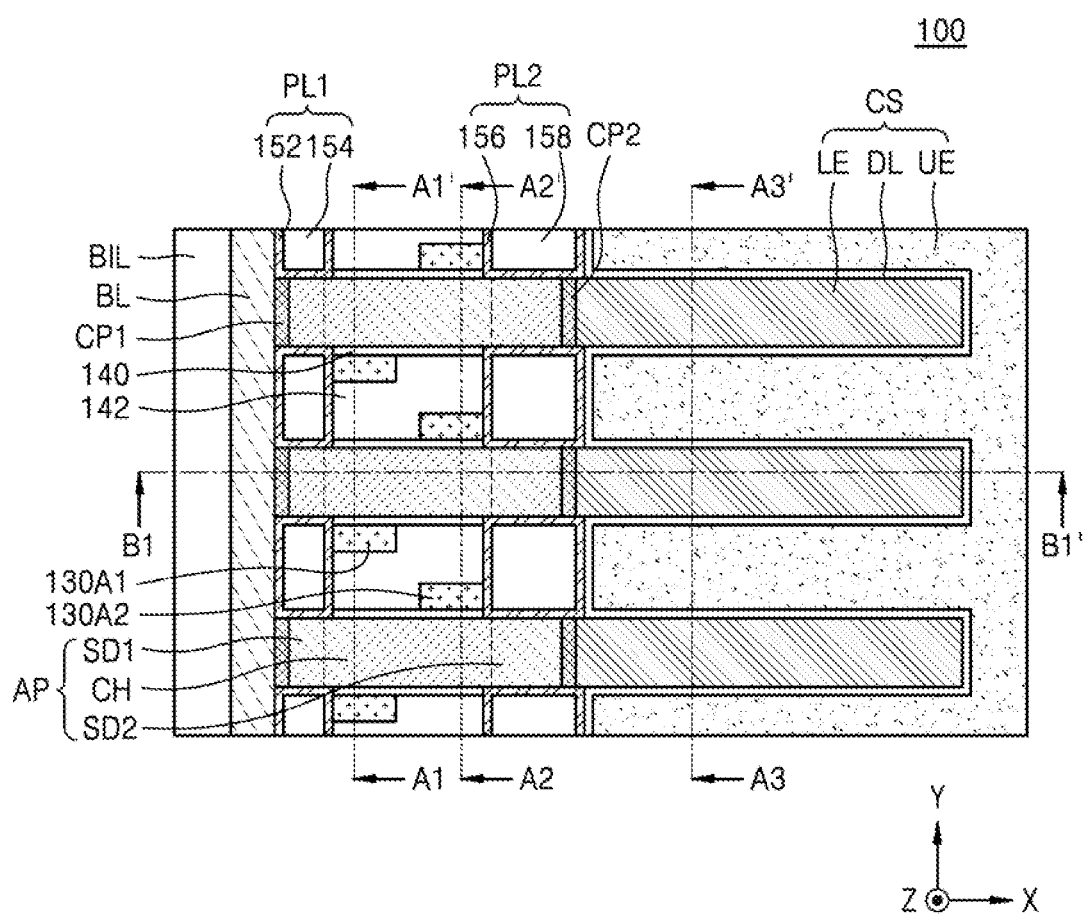
FIG. 8 is a plan view of a memory cell.
Figure 9:
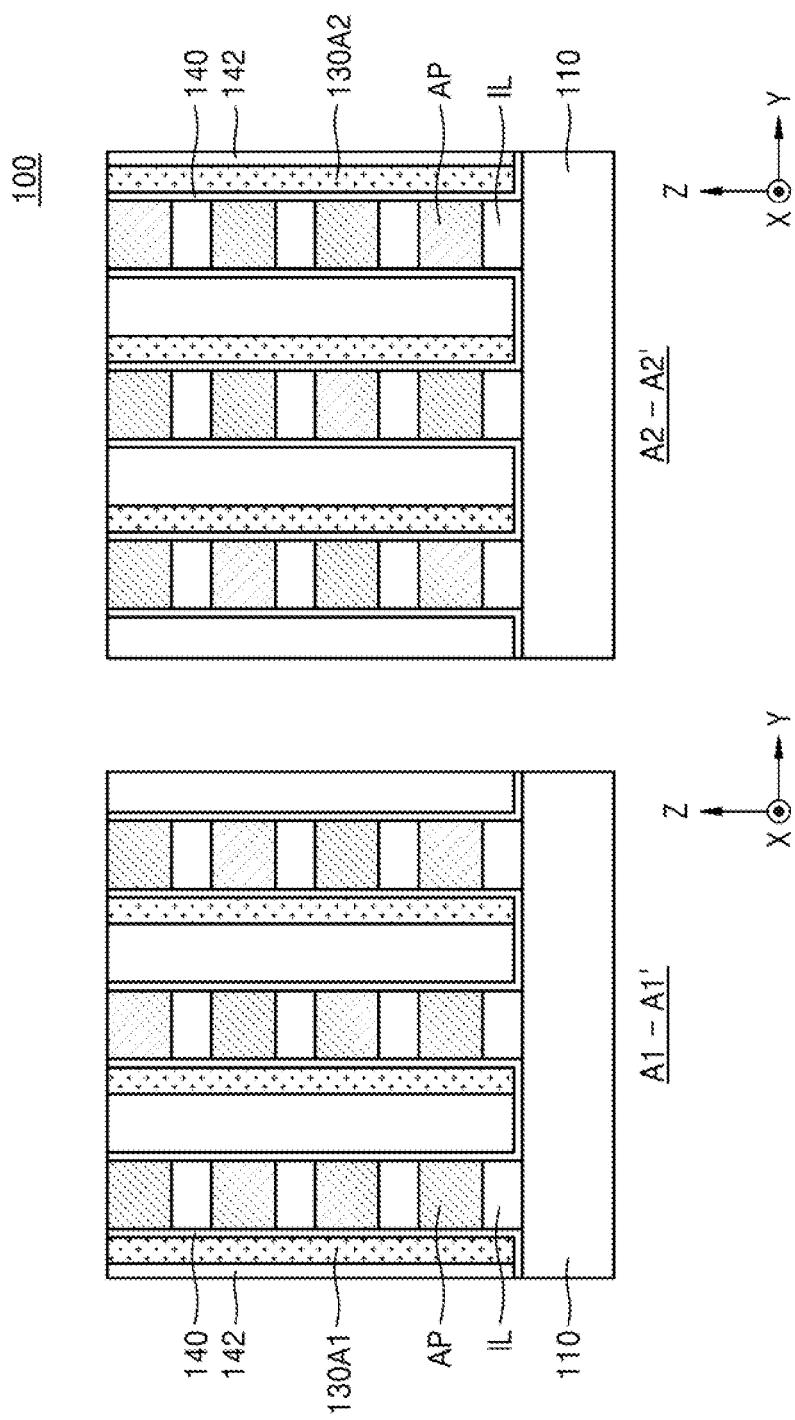
FIG. 9 is cross-sectional views of the memory cell taken along lines A1-A1' and A2-A2' of FIG. 8.
Figure 10:
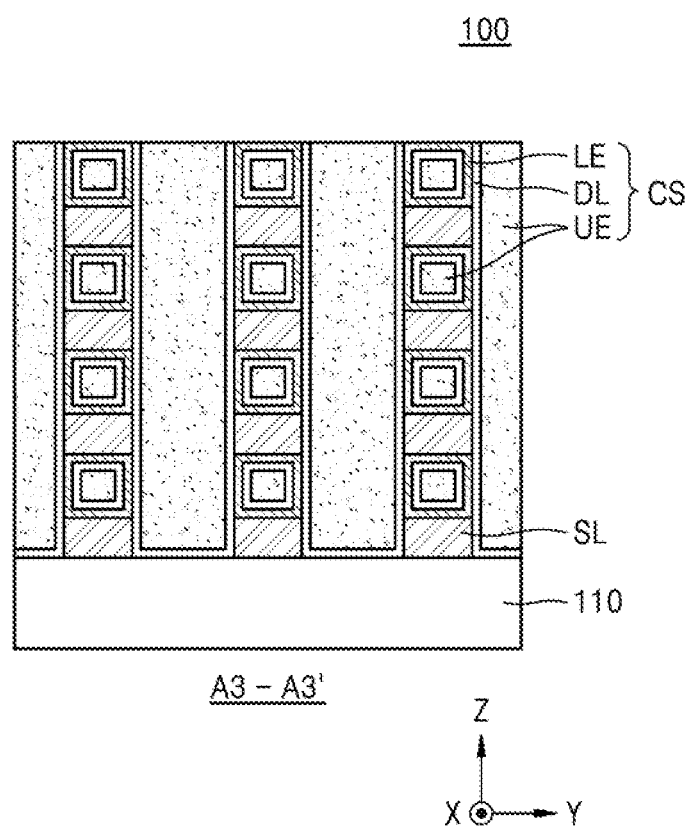
FIG. 10 is a cross-sectional view of the memory cell taken along line A3-A3' of FIG. 8.
Figure 11:
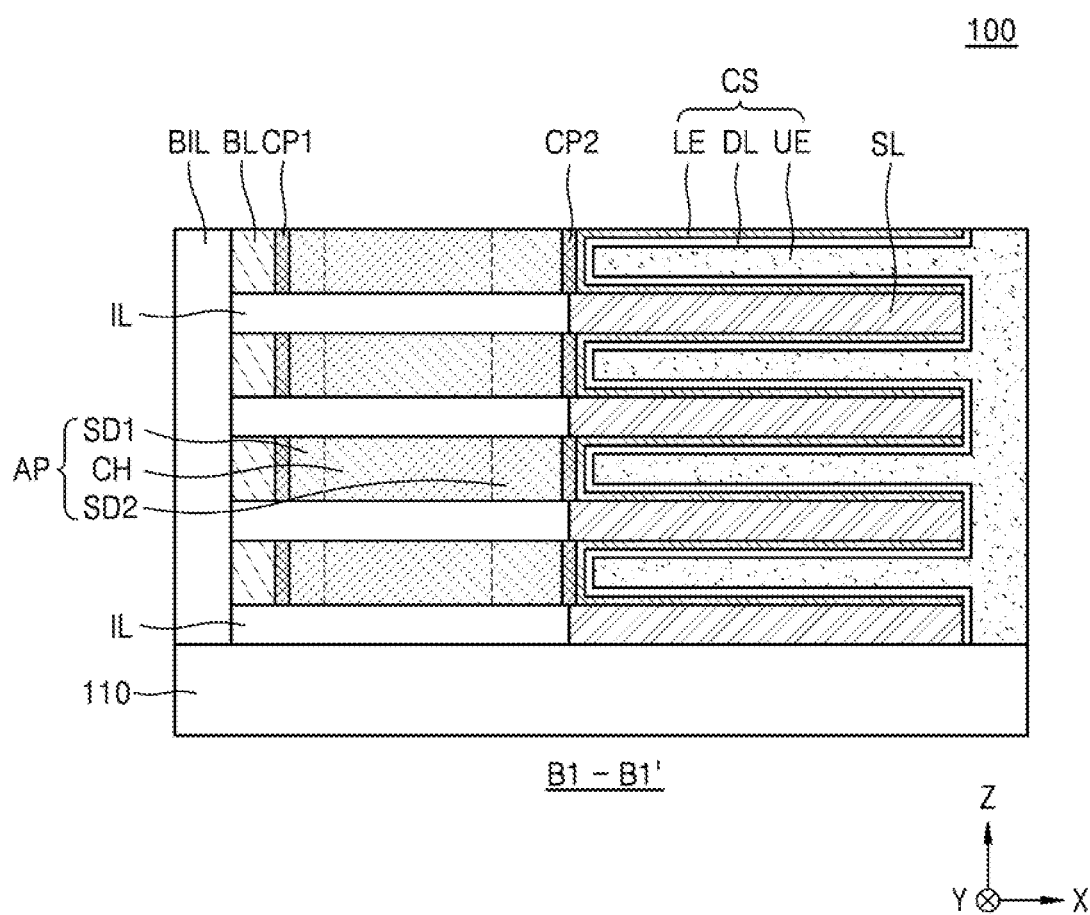
FIG. 11 is a cross-sectional view of the memory cell taken along line B1-B1' of FIG. 8.

FIG. 7 is a perspective view illustrating a memory cell MC included in the integrated circuit device 100 according to example embodiments of the present disclosure. FIG. 8 is a plan view of the memory cell MC, FIG. 9 is cross-sectional views of the memory cell MC taken along lines A1-A1' and A2-A2' of FIG. 8, FIG. 10 is a cross-sectional view of the memory cell MC taken along line A3-A3' of FIG. 8, and FIG. 11 is a cross-sectional view of the memory cell MC taken along line B1-B1' of FIG. 8. In FIG. 7, for convenience of illustration, a gate dielectric layer DL and an upper electrode UE are omitted.

Referring to FIGS. 7 to 11, the integrated circuit device 100 may include a plurality of semiconductor patterns AP, a plurality of bit lines BL, a plurality of word lines WL, and a capacitor structure CS, which are disposed on a substrate 110.

The substrate 110 may include Si, Ge, or SiGe. Alternatively, for example, the substrate 110 may include a silicon-on-insulator (SOI) substrate or a germanium-on-insulator (GeOI) substrate. A peripheral circuit and a wiring layer connected to the peripheral circuit may be further formed on a partial region of the substrate 110.

The plurality of semiconductor patterns AP disposed on the substrate 110 may extend in a first horizontal direction X and may be spaced apart from each other in a vertical direction Z. A mold insulating layer IL may be disposed between the plurality of semiconductor patterns AP.

The plurality of semiconductor patterns AP may include, for example, an undoped semiconductor material or a doped semiconductor material. In some embodiments, the plurality of semiconductor patterns AP may include polysilicon. In some embodiments, the plurality of semiconductor patterns AP may each include an amorphous metal oxide, a polycrystalline metal oxide, or a combination of an amorphous metal oxide and a polycrystalline metal oxide. For example, the plurality of semiconductor patterns AP may each include In—Ga-based oxide (IGO), In—Zn-based oxide (IZO), and/or In—Ga—Zn-based oxide (IGZO). In some other embodiments, the plurality of semiconductor patterns AP may include a two-dimensional (2D) material semiconductor. For example, the 2D material semiconductor may include $MoS_2$, $WSe_2$, graphene, carbon nanotubes, or a combination thereof.

The plurality of semiconductor patterns AP may have a line shape or bar shape extending in the first horizontal direction X. Each of the semiconductor patterns AP may include a channel region CH, and a first impurity region SD1 and a second impurity region SD2 disposed in the first horizontal direction X with the channel region CH therebetween. The first impurity region SD1 may be connected to the bit line BL, and the second impurity region SD2 may be connected to the capacitor structure CS.

The word line WL may include a first gate electrode 130A1 and a second gate electrode 130A2. The first gate electrode 130A1 may correspond to the first sub-word line WLX described with reference to FIGS. 1 to 6, and the second gate electrode 130A2 may correspond to the second sub-word line WLY described with reference to FIGS. 1 to 6. The first gate electrode 130A1 and the second gate electrode 130A2 may be disposed on a first sidewall and a second sidewall of each of the plurality of semiconductor patterns AP, the first sidewall and the second sidewall being opposite to each other, and may extend in the vertical direction Z. The first gate electrode A1 may be disposed at a first distance from the bit line BL, and the second gate electrode 130A2 may be disposed at a second distance that is greater than the first distance from the bit line BL.

The first gate electrode 130A1 and the second gate electrode 130A2 may include a doped semiconductor material (e.g., doped silicon, doped germanium, etc.), a conductive metal nitride (e.g., titanium nitride, tantalum nitride, etc.), a metal (e.g., tungsten, titanium, tantalum, etc.), and a metal-semiconductor compound (e.g., tungsten silicide, cobalt silicide, titanium silicide, etc.).

A gate insulating layer 140 may be disposed between the first gate electrode 130A1 and the semiconductor pattern AP, and between the second gate electrode 130A2 and the semiconductor pattern AP. The gate insulating layer 140 may include a high-k dielectric material and/or a ferroelectric material that have a higher dielectric constant than silicon oxide. In some embodiments, the gate insulating layer 140 may include hafnium oxide (HfO), hafnium silicate (HfSiO), hafnium oxide nitride (HfON), hafnium silicon oxide nitride (HfSiON), lanthanum oxide (LaO), lanthanum aluminum oxide (LaAlO), zirconium oxide (ZrO), zirconium silicate (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), and/or lead scandium tantalum oxide (PbScTaO).

A gap-fill insulating layer 142 may be disposed between the first gate electrode 130A1 disposed on a sidewall of one semiconductor pattern AP and the second gate electrode 130A2 disposed on a sidewall of another semiconductor pattern AP adjacent to the one semiconductor pattern AP. The gap-fill insulating layer 142 may fill a space between the first gate electrode 130A1 and the second gate electrode 130A2 adjacent to each other. The gap-fill insulating layer 142 may include silicon oxide, silicon oxynitride, silicon nitride, carbon-containing silicon oxide, carbon-containing silicon oxynitride, carbon-containing silicon nitride, or a combination thereof.

The plurality of bit lines BL may extend on the substrate 110 in a second horizontal direction Y and may be spaced apart from each other in the vertical direction Z. The plurality of bit lines BL may include doped polysilicon, metal, conductive metal nitride, conductive metal silicide, conductive metal oxide, or a combination thereof. For example, the plurality of bit lines BL may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but the present disclosure is not necessarily limited thereto. The plurality of bit lines BL may each include a single layer or multiple layers of the aforementioned materials. In example embodiments of the present disclosure, the plurality of bit lines BL may include a 2D semiconductor material. For example, the 2D semiconductor material may include graphene, carbon nanotubes, or a combination thereof.

A contact layer CP1 may be disposed between the plurality of bit lines BL and the plurality of semiconductor patterns AP connected thereto. A capacitor contact layer CP2 may be disposed between the plurality of semiconductor patterns AP and a lower electrode LE connected thereto. The contact layer CP1 and the capacitor contact layer CP2 may each include a metal silicide material, and may include, for example, titanium silicide, tungsten silicide, cobalt silicide, and/or nickel silicide.

A first vertical insulating structure PL1 may be disposed on both sidewalls of a semiconductor pattern AP disposed adjacent to the plurality of bit lines BL, and a second vertical insulating structure PL2 may be disposed on both sidewalls of a semiconductor pattern AP disposed adjacent to the capacitor structure CS. For example, the first vertical insulating structure PL1 may extend in the vertical direction Z on the sidewalls of the first impurity region SD1 and the contact layer CP1, and may include a first liner 152 and a first gap fill layer 154. The second vertical insulating structure PL2 may extend in the vertical direction Z on the sidewalls of the second impurity region SD2 and the capacitor contact layer CP2, and may include a second liner 156 and a second gap fill layer 158.

The capacitor structure CS may include a plurality of lower electrodes LE, a capacitor dielectric layer DL, and an upper electrode UE. The plurality of lower electrodes LE may extend in the first horizontal direction X and may be spaced apart from each other in the vertical direction Z. Each of the lower electrodes LE may have an inner space extending in the first horizontal direction X, and the inner space may be filled by the capacitor dielectric layer DL and the upper electrode UE.

The plurality of lower electrodes LE may be alternately disposed with a plurality of support layers SL in the vertical direction Z, and the plurality of lower electrodes LE may be disposed at the same vertical level as the plurality of semiconductor patterns AP. The support layers SL may be disposed between the plurality of lower electrodes LE to prevent the lower electrodes LE from collapsing or leaning in a process of forming the lower electrodes LE.

The capacitor dielectric layer DL may be conformally disposed on the inner space of the lower electrode LE, and may be disposed on a pair of first sidewalls LES1 of the lower electrode LE and a sidewall of the support layer SL. The capacitor dielectric layer DL might not be disposed on the upper surface of the lower electrode LE.

In example embodiments of the present disclosure, the capacitor dielectric layer DL may include a high-k dielectric material and/or a ferroelectric material that have a higher dielectric constant than silicon oxide. In some embodiments of the present disclosure, the capacitor dielectric layer DL may include HfO, HfSiO, HfON, HfSiON, LaO, LaAlO, ZrO, ZrSiO, ZrON, ZrSiON, TaO, TiO, BaSrTiO, BaTiO, PZT, STB, BFO, SrTiO, YO, AlO, and/or PbScTaO.

The upper electrode UE may cover the plurality of lower electrodes LE and the support layer SL with the capacitor dielectric layer DL therebetween.

The lower electrode LE and the upper electrode UE may include a doped semiconductor material, a conductive metal nitride such as titanium nitride, tantalum nitride, niobium nitride, or tungsten nitride, a metal such as ruthenium, iridium, titanium, or tantalum, or a conductive metal oxide such as iridium oxide or niobium oxide.

According to the above-described example embodiments of the present disclosure, when a memory cell transistor is turned off (e.g., not selected), the negative voltage VBB2 may be applied to the first gate electrode 130A1 and the buffer voltage VPT may be applied to the second gate electrode 130A2, and accordingly a floating body effect may decrease and a GIDL current may significantly decrease. The integrated circuit device 100 may have excellent electrical performance.

Figure 12:
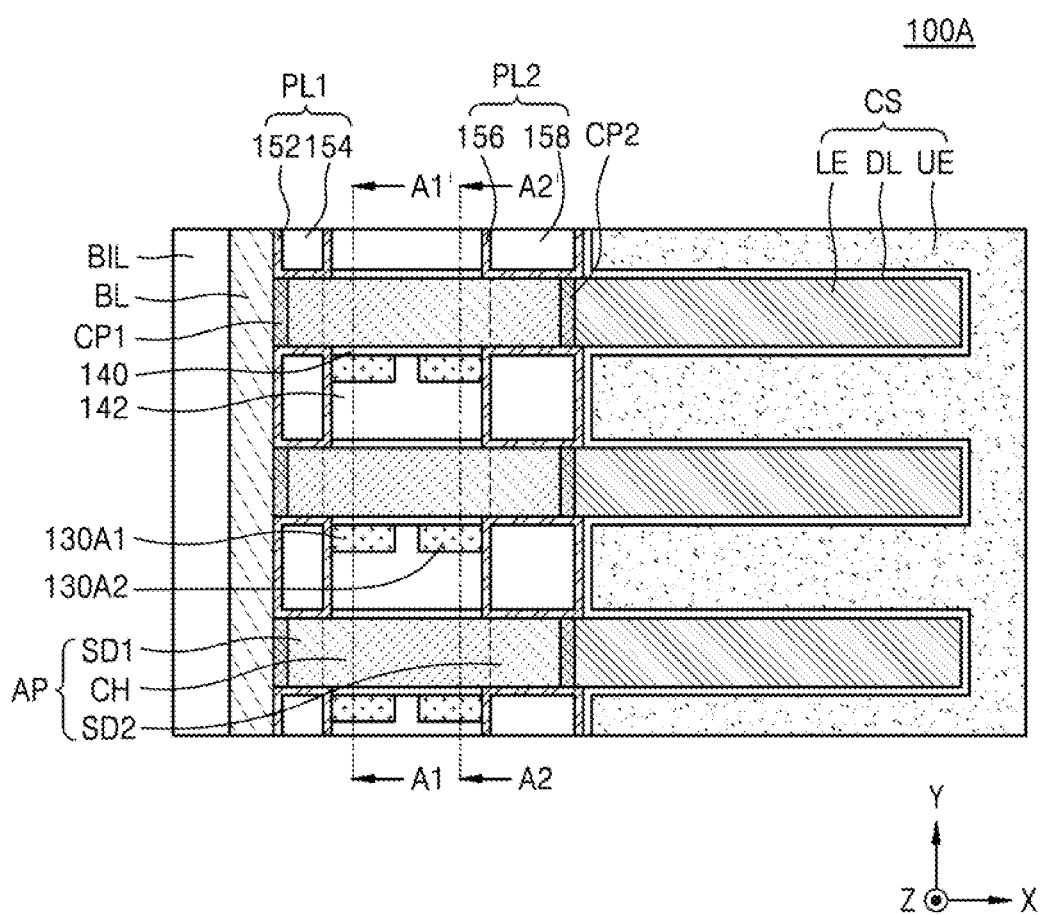
FIG. 12 is a plan view illustrating an integrated circuit device according to example embodiments of the present disclosure.
Figure 13:
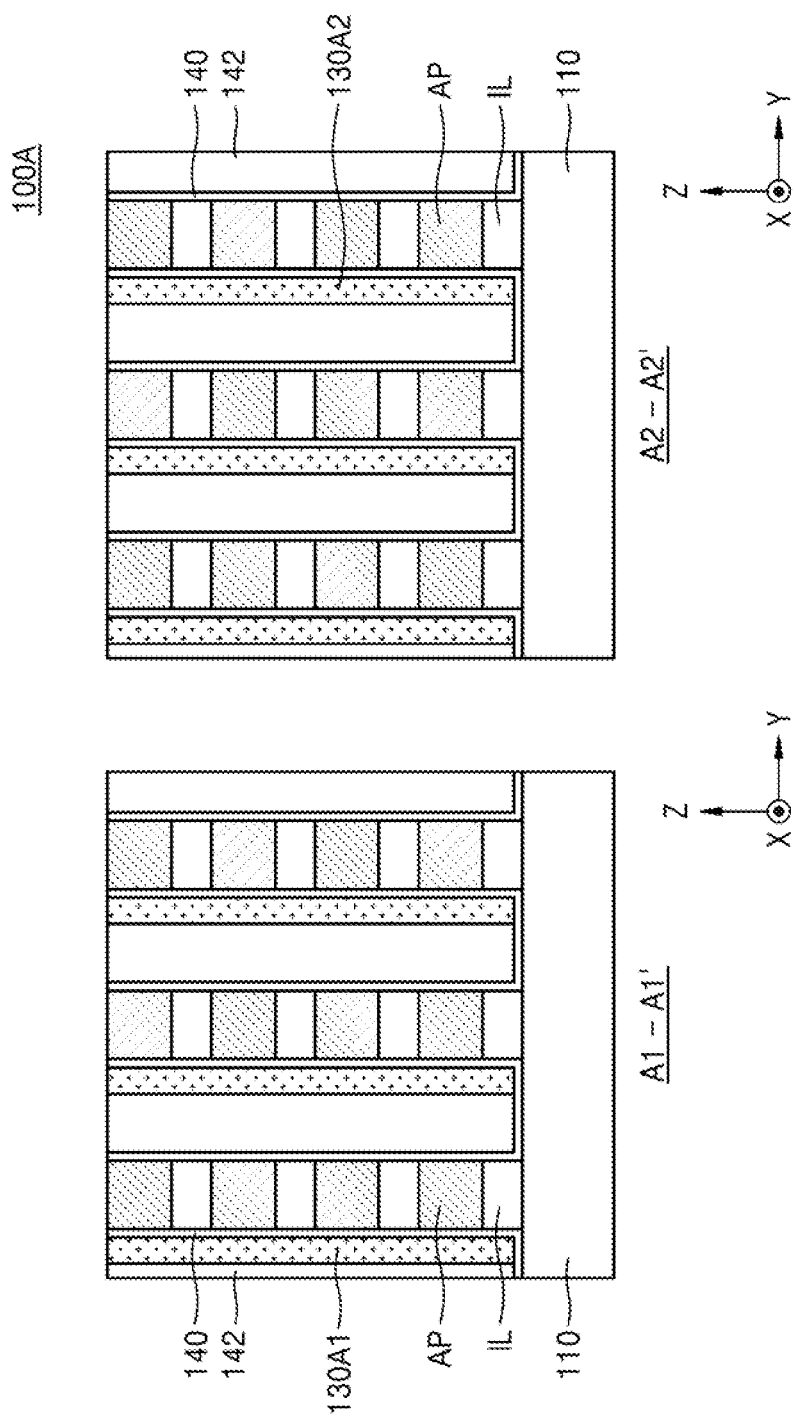
FIG. 13 is a cross-sectional view of the integrated circuit device taken along line A1-A1' of FIG. 12.

FIG. 12 is a plan view illustrating an integrated circuit device 100A according to example embodiments of the present disclosure, and FIG. 13 is a cross-sectional view of the integrated circuit device 100A taken along line A1-A1' of FIG. 12.

Referring to FIGS. 12 and 13, a first gate electrode 130A1 and a second gate electrode 130A2 may be spaced apart from each other on the same sidewall of a plurality of semiconductor patterns AP and extend in a vertical direction Z. Accordingly, the first gate electrode 130A1 and the second gate electrode 130A2 may be disposed on first sidewalls of a plurality of semiconductor patterns AP, and a gap-fill insulating layer 142 may at least partially surround second sidewalls of the plurality of semiconductor patterns AP.

Figure 14:
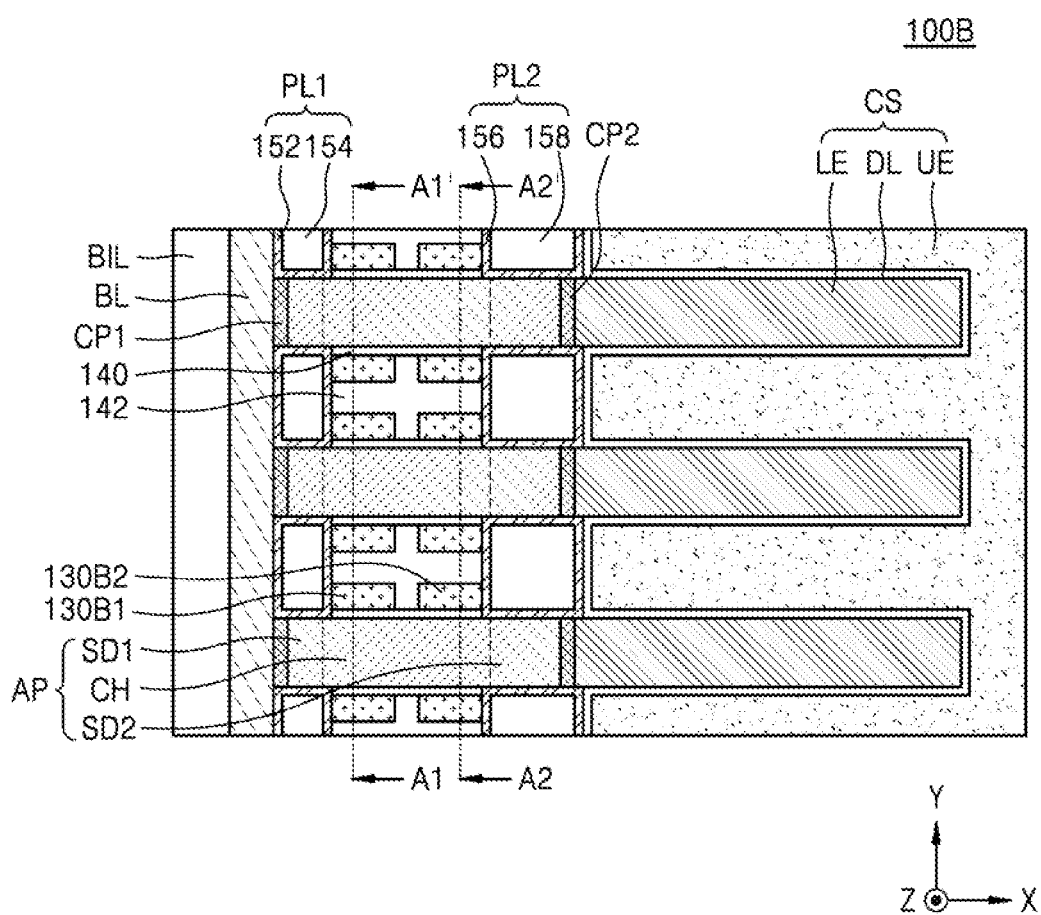
FIG. 14 is a plan view illustrating an integrated circuit device according to example embodiments of the present disclosure.
Figure 15:
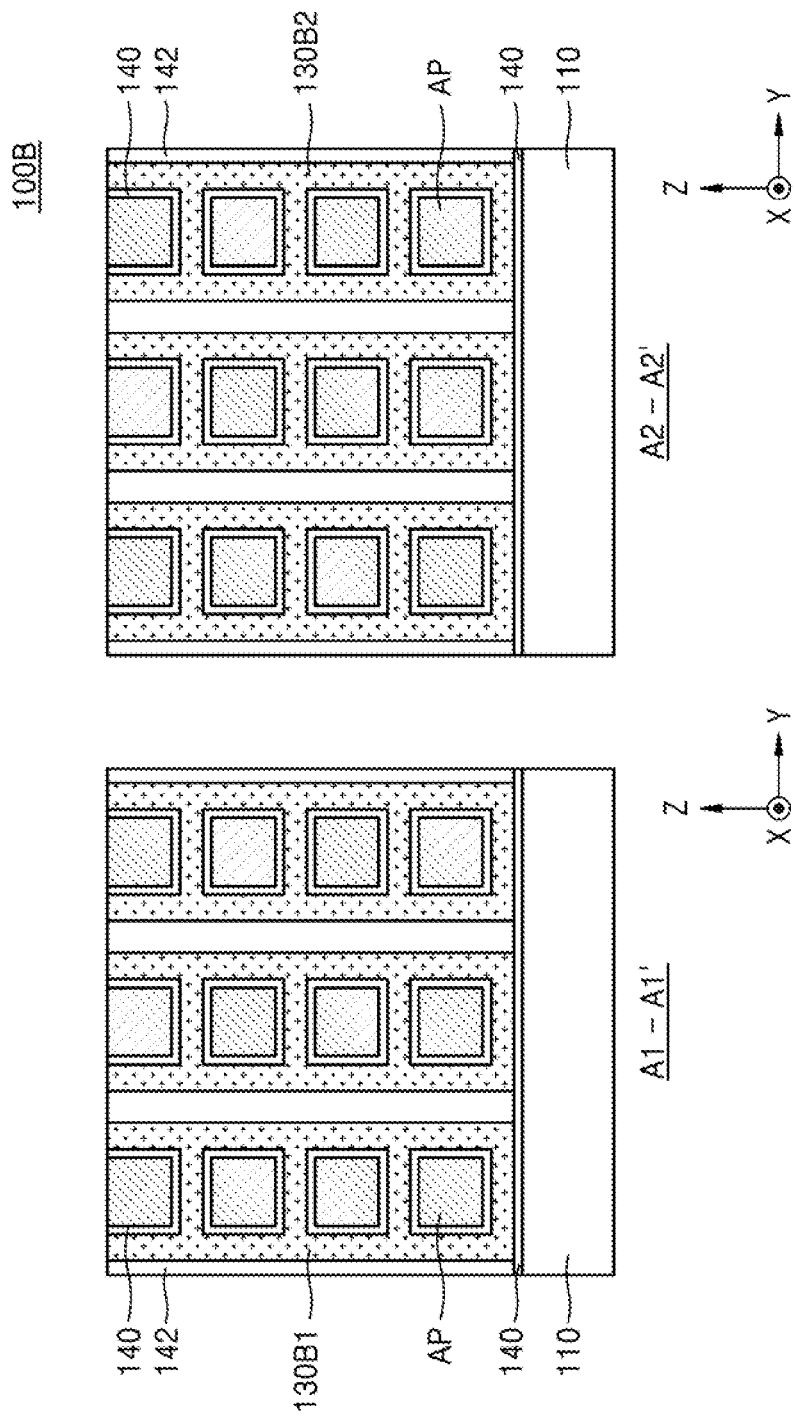
FIG. 15 is a cross-sectional view of the integrated circuit device taken along line A1-A1' of FIG. 14.

FIG. 14 is a plan view illustrating an integrated circuit device 100B according to example embodiments of the present disclosure, and FIG. 15 is a cross-sectional view of the integrated circuit device 100B taken along line A1-A1' in FIG. 14.

Referring to FIGS. 14 and 15, a first gate electrode 130B 1 and a second gate electrode 130B2 may be gate-all-around-type gate electrodes. The first gate electrode 130B 1 may at least partially surround the top surface, the bottom surface, and both sidewalls of a plurality of semiconductor patterns AP and may extend in a vertical direction Z. The second gate electrode 130B2 may be spaced apart from the first gate electrode 130B1 and may at least partially surround the top surface, the bottom surface, and both sidewalls of the plurality of semiconductor patterns AP, and may extend in the vertical direction Z. The gap-fill insulating layer 142 may fill a space between the first gate electrode 130B1 and the second gate electrode 130B2.

Figure 16:
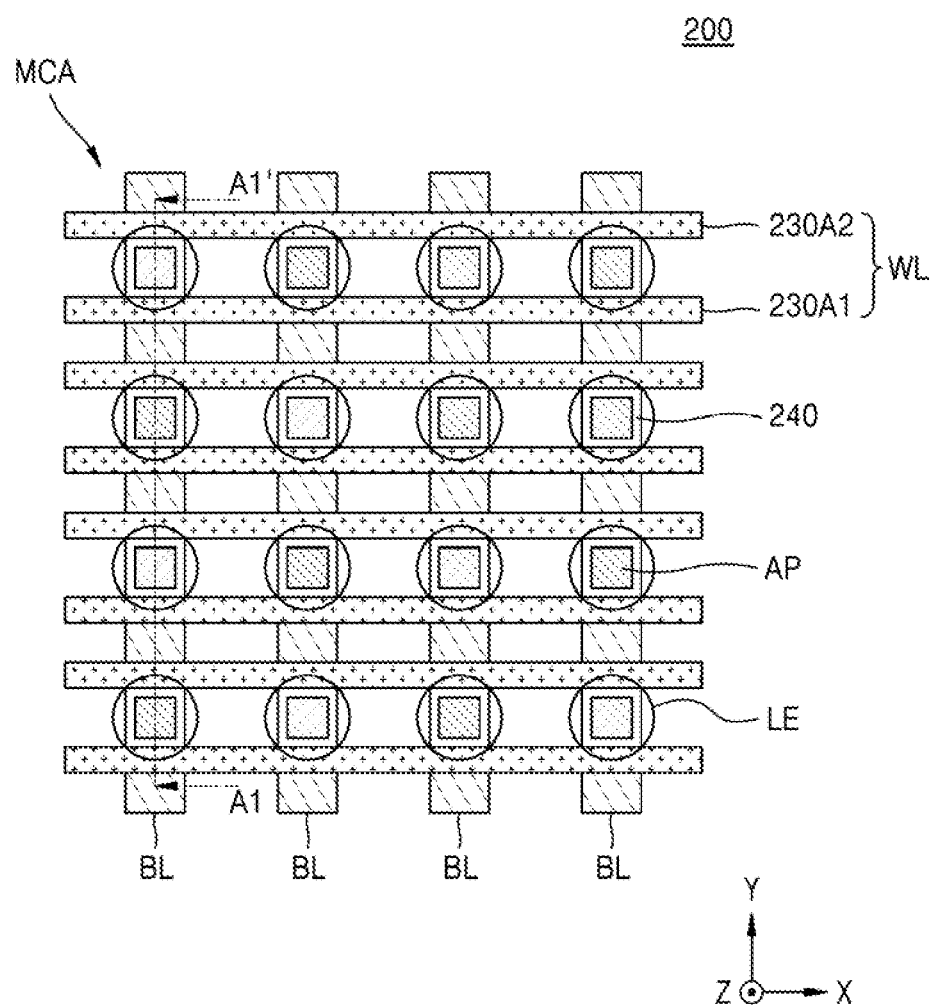
FIG. 16 is a layout diagram illustrating a cell array area of an integrated circuit device according to example embodiments of the present disclosure.
Figure 17:
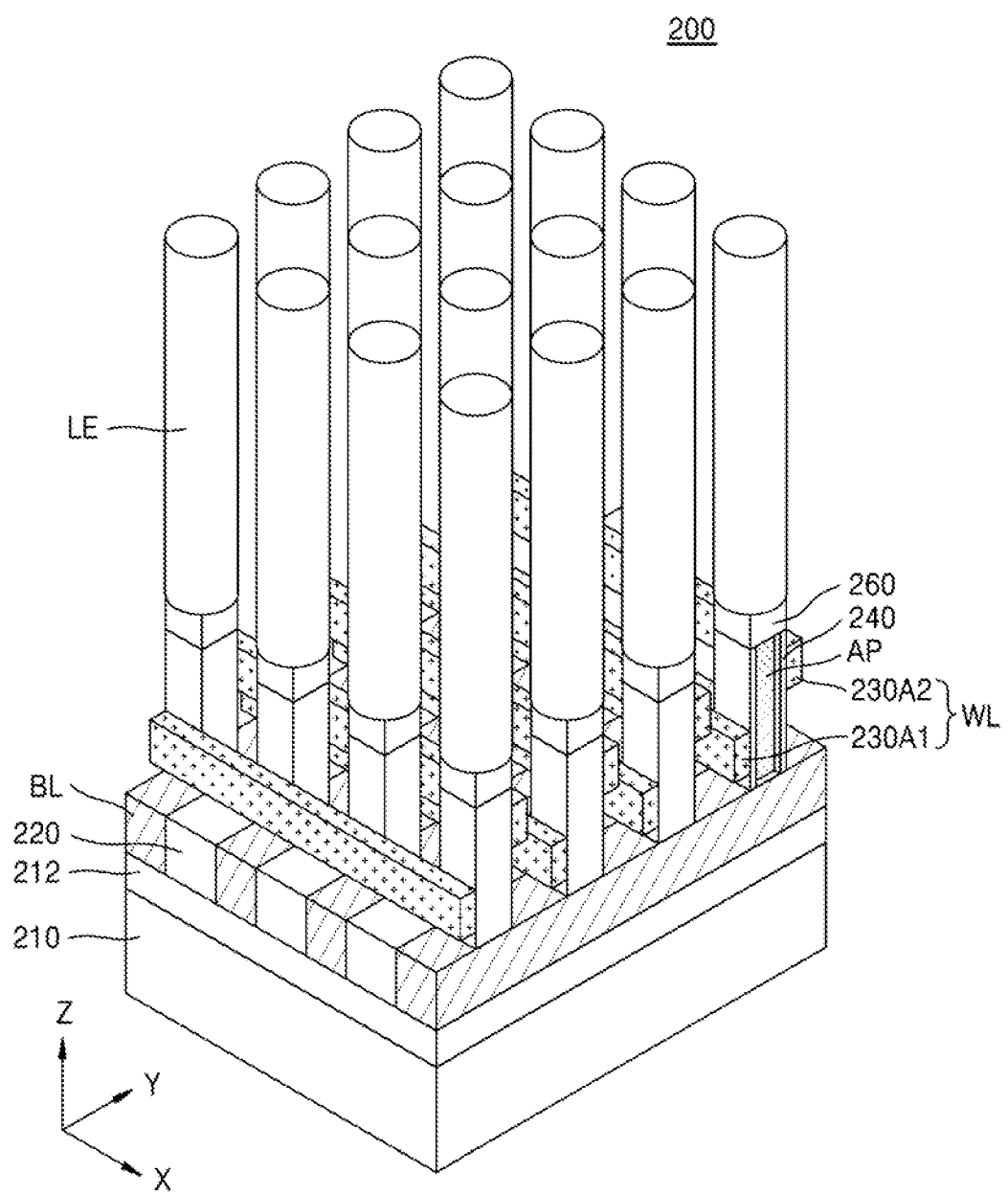
FIG. 17 is a perspective view illustrating the integrated circuit device of FIG. 16.
Figure 18:
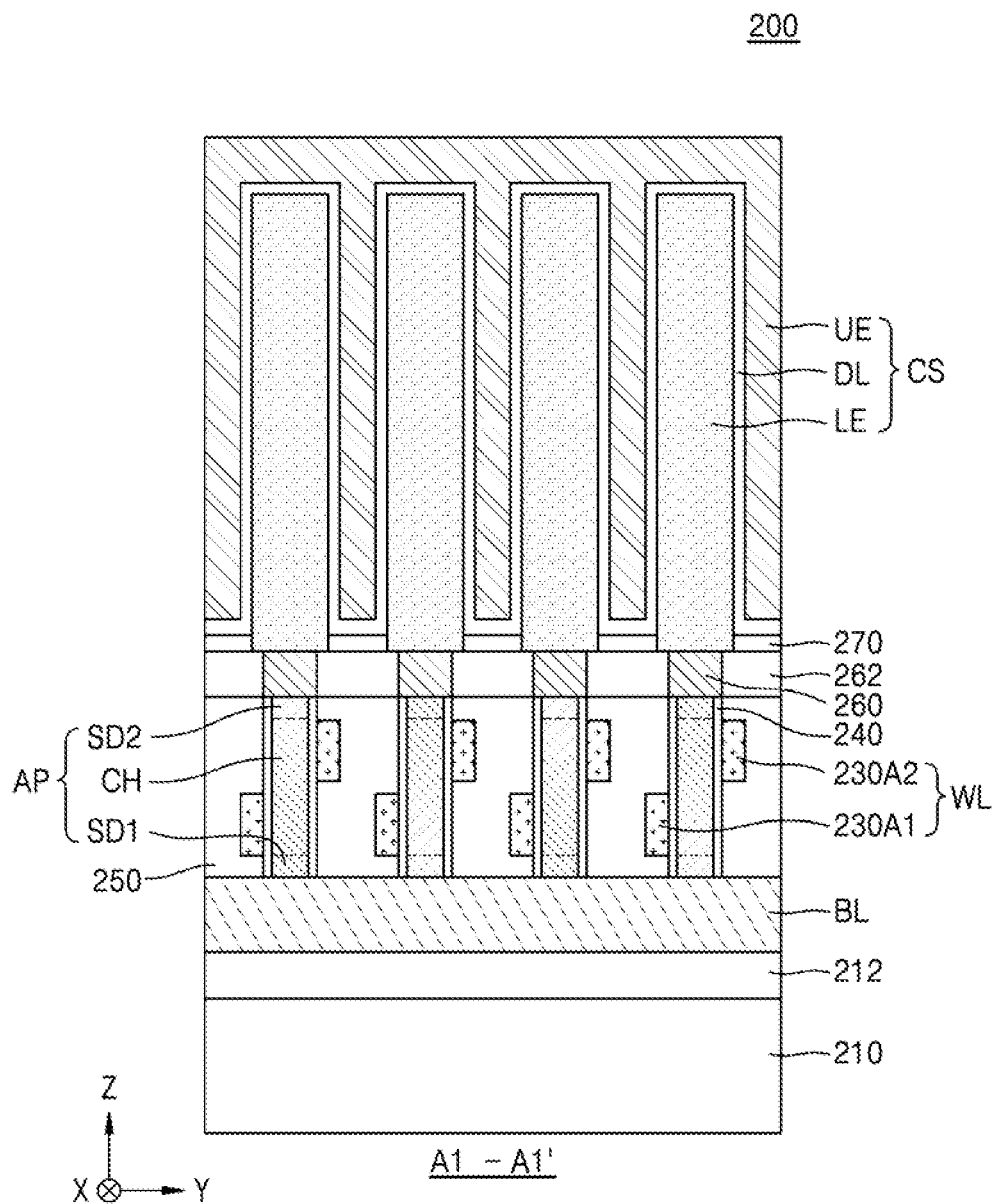
FIG. 18 is a cross-sectional view illustrating the integrated circuit device taken along line A1-A1' of FIG. 16.

FIG. 16 is a layout diagram illustrating a cell array area MCA of an integrated circuit device 200 according to example embodiments of the present disclosure, FIG. 17 is a perspective view illustrating the integrated circuit device 200, and FIG. 18 is a cross-sectional view of the integrated circuit device 200 taken along line A1-A1' of FIG. 16.

Referring to FIGS. 16 to 18, the cell array area MCA may include a vertical channel transistor (VCT)-type DRAM device. The VCT may refer to a structure in which a channel region CH of a semiconductor pattern AP extends from a substrate 210 in a vertical direction. The cell array area MCA may include the substrate 210, a plurality of bit lines BL, a plurality of semiconductor patterns AP, a plurality of word lines WL, a gate insulating layer 240, and a capacitor structure CS.

A lower insulating layer 212 may be disposed on the substrate 210, and the plurality of bit lines BL on the lower insulating layer 212 may be spaced apart from each other in a first direction X and extend in a second direction Y. A plurality of first insulating patterns 220 may be disposed on the lower insulating layer 212 to fill a space between the plurality of bit lines BL. The plurality of first insulating patterns 220 may extend in the second direction Y, and the top surfaces of the plurality of first insulating patterns 220 may be disposed at the same level as the top surfaces of the plurality of bit lines BL.

The plurality of semiconductor patterns AP may be disposed in a matrix form in which the plurality of semiconductor patterns AP are spaced apart from each other in the first direction X and the second direction Y on the plurality of bit lines BL. Each of the plurality of semiconductor patterns AP may have a first width in the first direction X and a first height in a third direction Z, and the first height may be greater than the first width. For example, the first height may be about 2 to about 10 times the first width, but the present disclosure is not necessarily limited thereto. Each of the plurality of semiconductor patterns AP may include a first source/drain region SD1, a channel region CH, and a second source/drain region SD2. The first source/drain region SD1 may be disposed adjacent to the plurality of bit lines BL, and the second source/drain region SD2 may be disposed adjacent to the capacitor structure CS.

In example embodiments of the present disclosure, the plurality of semiconductor patterns AP may each include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. Each of the plurality of semiconductor patterns AP may include a single layer or multiple layers of the oxide semiconductor. In some examples, each of the plurality of semiconductor patterns AP may have a band gap energy greater than that of silicon. For example, each of the plurality of semiconductor patterns AP may have a band gap energy of about 1.5 eV to about 5.6 eV. For example, the plurality of semiconductor patterns AP may have optimal channel performance when having a band gap energy of about 2.0 eV to about 4.0 eV. For example, the plurality of semiconductor patterns AP may be polycrystalline or amorphous, but are not necessarily limited thereto. In example embodiments of the present disclosure, the plurality of semiconductor patterns AP may include a 2D semiconductor material. For example, the 2D semiconductor material may include graphene, carbon nanotubes, or a combination thereof.

The word line WL may include a first gate electrode 230A1 and a second gate electrode 230A2 that extend in the first direction X on both sidewalls of the plurality of semiconductor patterns AP. The first gate electrode 230A1 may face a first sidewall of each of the semiconductor patterns AP and extend in the first direction X. The second gate electrode 230A2 may face a second sidewall opposite to the first sidewall of the semiconductor pattern AP and extend in the first direction X. The top surface of the second gate electrode 230A2 may be disposed at a higher level than the top surface of the first gate electrode 230A1.

The first gate electrode 230A1 may correspond to the first sub-word line WLX (see FIG. 3), and the second gate electrode 230A2 may correspond to the second sub-word line WLY (see FIG. 3). When a memory cell is selected, the boosted voltage VPP may be applied to the first gate electrode 230A1 and the second gate electrode 230A2, and when the memory cell is not selected, the negative voltage VBB2 may be applied to the first gate electrode 230A1 and the buffer voltage VPT may be applied to the second gate electrode 230A2.

The gate insulating layer 240 may at least partially surround the sidewall of the semiconductor pattern AP and may be disposed between the semiconductor pattern AP and the word line WL. In example embodiments of the present disclosure, the gate insulating layer 240 may include a silicon oxide layer, a silicon oxynitride layer, a high-k dielectric layer having a higher dielectric constant than the silicon oxide layer, or a combination thereof.

A buried layer 250 filling a space between the semiconductor patterns AP may be disposed on the plurality of first insulating patterns 220. The buried layer 250 may cover side surfaces of the first and second gate electrodes 230A1 and 230A2. The buried layer 250 may have a structure including a plurality of insulating layers at different levels.

Capacitor contacts 260 may be disposed on the semiconductor patterns AP. The capacitor contacts 260 may vertically overlap the semiconductor patterns AP, and may be disposed in a matrix form in which the capacitor contacts 260 are spaced apart from each other in the first direction X and the second direction Y. An upper insulating layer 262 may at least partially surround the sidewall of each of the capacitor contacts 260 on the buried layer 250.

An etch stop layer 270 may be disposed on the upper insulating layer 262, and a capacitor structure CS may be disposed on the etch stop layer 270. The capacitor structure CS may include a lower electrode LE, a capacitor dielectric layer DE, and an upper electrode UE.

The lower electrode LE may pass through the etch stop layer 270 and be electrically connected to the top surface of the capacitor contact 260. The lower electrode 282 may be formed in a pillar type extending in the third direction Z, but the present disclosure is not necessarily limited thereto. In example embodiments of the present disclosure, lower electrodes LE may vertically overlap the capacitor contacts 260 and may be disposed in a matrix form in which the lower electrodes LE are spaced apart from each other in the first direction X and the second direction Y. Alternatively, a landing pad may be further disposed between the capacitor contact 260 and the lower electrode LE, and thus, the lower electrode LE may be disposed in a hexagonal shape.

Figure 19:
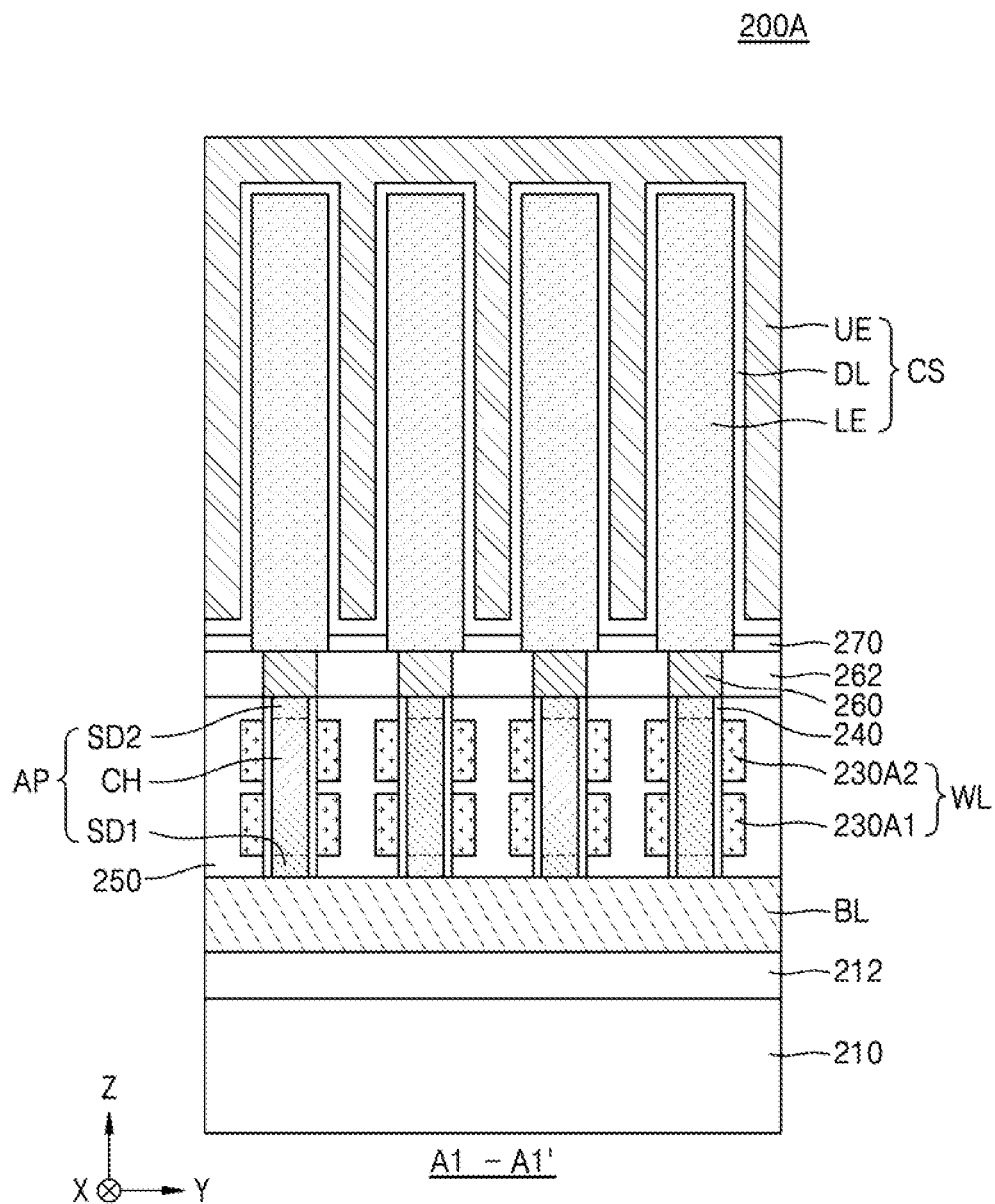
FIG. 19 is a cross-sectional view illustrating an integrated circuit device according to example embodiments of the present disclosure.

FIG. 19 is a cross-sectional view illustrating an integrated circuit device 200A according to example embodiments of the present disclosure. Specifically, FIG. 19 is a cross-sectional view taken along line A1-A1' of FIG. 16.

Referring to FIG. 19, the first gate electrode 230A1 may face both sidewalls of the semiconductor pattern AP and extend in the first direction X, and the second gate electrode 230A2 may face both sidewalls of the semiconductor pattern AP and extend in the first direction X at a vertical level higher than that of the first gate electrode 230A1. The first gate electrode 230A1 and the second gate electrode 230A2 may be spaced apart from each other in the vertical direction Z, and the buried layer 250 may fill a space between the first gate electrode 230A1 and the second gate electrode 230A2.

In example embodiments of the present disclosure, the first gate electrode 230A1 may be disposed on a first sidewall of the lower side (e.g., the lower side of a channel region CH) of the semiconductor pattern AP and a second sidewall opposite to the first sidewall of the lower side of the semiconductor pattern AP. The second gate electrode 230A2 may be disposed on a first sidewall of the upper side (e.g., the upper side of the channel region CH) of the semiconductor pattern AP and a second sidewall opposite to the first sidewall of the upper side of the semiconductor pattern AP. In this case, the first gate electrode 230A1 and the second gate electrode 230A2 may be referred to as a dual gate-type gate electrode.

In other embodiments, the first gate electrode 230A1 may extend in the first direction X while surrounding the entire sidewall of the lower side (e.g., the lower side of the channel region CH) of the semiconductor pattern AP, and the second gate electrode 230A2 may extend in the first direction X while surrounding the entire sidewall of the upper side (e.g., the upper side of the channel region CH) of the semiconductor pattern AP. In this case, the first gate electrode 230A1 and the second gate electrode 230A2 may be referred to as gate-all-around-type gate electrodes.

The first gate electrode 230A1 may correspond to the first sub-word line WLX (see FIG. 3), and the second gate electrode 230A2 may correspond to the second sub-word line WLY (see FIG. 3). When a memory cell is selected, the boosted voltage VPP may be applied to the first gate electrode 230A1 and the second gate electrode 230A2, and when the memory cell is not selected, the negative voltage VBB2 may be applied to the first gate electrode 230A1 and the buffer voltage VPT may be applied to the second gate electrode 230A2. Accordingly, the integrated circuit device 200A may have a reduced off current, and a GIDL current may be significantly reduced.

Figure 20:
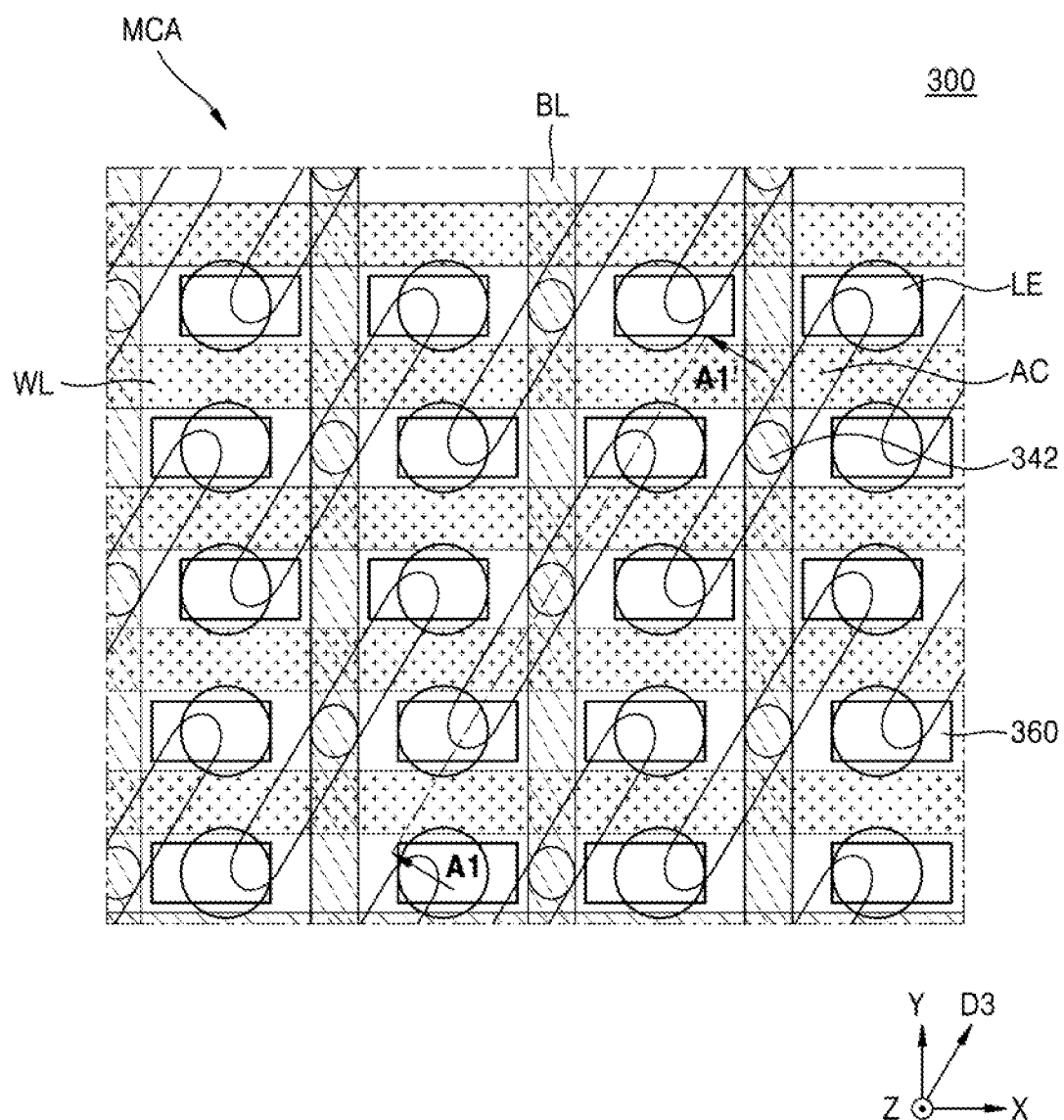
FIG. 20 is a layout diagram illustrating a cell array area of an integrated circuit device according to example embodiments of the present disclosure.
Figure 21:
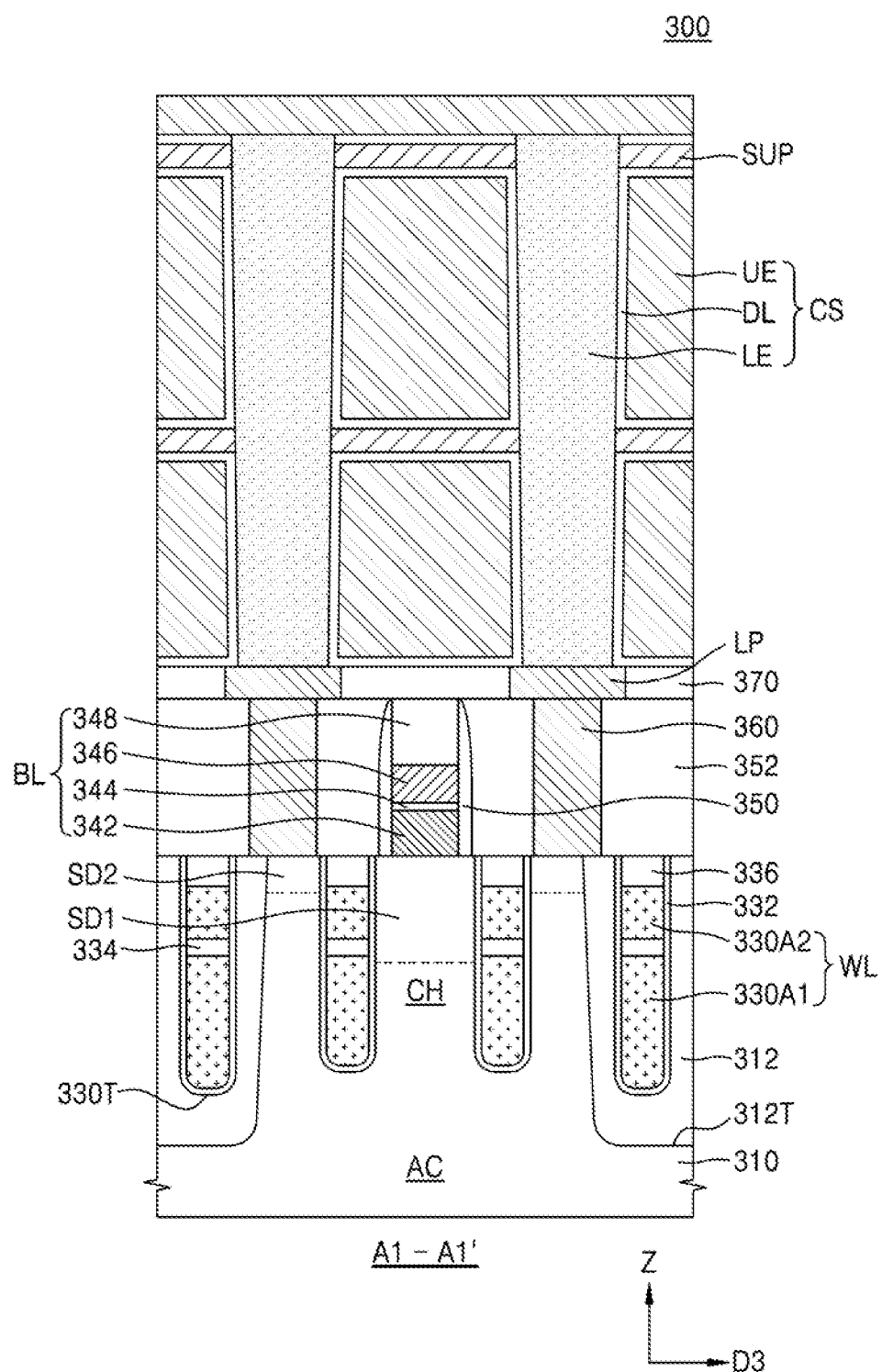
FIG. 21 is a cross-sectional view illustrating the integrated circuit device taken along line A1-A1' of FIG. 20.

FIG. 20 is a layout diagram illustrating a cell array area MCA of an integrated circuit device 300 according to example embodiments of the present disclosure, and FIG. 21 is a cross-sectional view of the integrated circuit device 300 taken along line A1-A1' of FIG. 20.

Referring to FIGS. 20 and 21, the cell array area MCA may include a buried gate cell array transistor (BCAT)-type DRAM device.

A device isolation trench 312T may be formed in a substrate 310, and a device isolation layer 312 may be formed in the device isolation trench 312T. In the cell array area MCA, a plurality of active regions AC may be defined in the substrate 310 by the device isolation layer 312.

The plurality of active regions AC may be disposed to respectively have long axes in a diagonal direction with respect to a first direction X and a second direction Y. A plurality of word lines WL may extend parallel to each other in the first direction X across the plurality of active regions AC. A plurality of bit lines BL may extend parallel to each other in the second direction Y on the plurality of word lines WL. The plurality of bit lines BL may be connected to the plurality of active regions AC. In some embodiments, the plurality of bit lines BL may be connected to the plurality of active regions AC through direct contacts.

A plurality of contact plugs 360 may be formed between two bit lines BL adjacent to each other from among the plurality of bit lines BL. The plurality of contact plugs 360 may be disposed in a line in the first direction X and the second direction Y. A plurality of landing pads LP may be formed on the plurality of contact plugs 360. The plurality of contact plugs 360 and the plurality of landing pads LP may connect a lower electrode of a capacitor formed at a level higher than the plurality of bit lines BL to the active region AC. The plurality of landing pads LP may be disposed to partially overlap the plurality of contact plugs 360, respectively.

In the cell array area MCA, a plurality of word line trenches 330T extending in the first direction X may be formed in the substrate 310, and a first gate electrode 330A1 and a second gate electrode 330A2 may be disposed in the plurality of word line trenches 330T. The first gate electrode 330A1 may fill a lower side of each of the plurality of word line trenches 330T, and the second gate electrode 330A2 may be at an upper side of each of the plurality of word line trenches 330T and may be spaced apart from the first gate electrode 330A1. The second gate electrode 330A2 may be disposed at a higher vertical level than the first gate electrode 330A1, and the second gate electrode 330A2 may be disposed closer to the top surface of the substrate 310 than the first gate electrode 330A1.

A gate insulating layer 332 may be disposed on the inner walls of the plurality of word line trenches 330T and be between the substrate 310 and the first gate electrode 330A1 and between the substrate 310 and the second gate electrode 330A2. A buried insulating layer 334 may be further disposed between the first gate electrode 330A1 and the second gate electrode 330A2 and insulate the first gate electrode 330A1 from the second gate electrode 330A2. A gate capping layer 336 may be further disposed on the second gate electrode 330A2 on the inner walls of the plurality of word line trenches 330T.

A first source/drain region SD1 and a second source/drain region SD2 may be disposed in the active region AC on both sides of the word line trenches 330T.

The plurality of bit lines BL may extend in the second direction Y on the substrate 310. Although FIG. 21 illustrates that the plurality of bit lines BL are disposed directly on the substrate 310, a direct contact may be further disposed between the plurality of bit lines BL and the substrate 310. For example, each of the plurality of bit lines BL may be electrically connected to the second source/drain region SD2.

Each of the plurality of bit lines BL may include a lower conductive pattern 342, an intermediate conductive pattern 344, and an upper conductive pattern 346 sequentially stacked on the substrate 310. The lower conductive pattern 342 may include doped polysilicon. The intermediate conductive pattern 344 and the upper conductive pattern 346 may each include TiN, TiSiN, tungsten (W), tungsten silicide, or a combination thereof. In example embodiments of the present disclosure, the intermediate conductive pattern 344 may include TiN, TiSiN, or a combination thereof, and the upper conductive pattern 346 may include W. A capping layer 348 may be disposed on the upper surface of each of the plurality of bit lines BL, and a spacer 350 may be further disposed on sidewalls of each of the plurality of bit lines BL.

A contact plug 360 electrically connected to the first source/drain region SD1 may be disposed on the substrate 310. A buried insulating layer 352 at least partially surrounding the contact plug 360 and the bit line BL may be disposed on the substrate 310.

A landing pad LP may be formed on the contact plug 360. An insulating layer 370 disposed on the buried insulating layer 352 may at least partially surround the landing pad LP. The plurality of landing pads LP may have a plurality of island-like pattern shapes in a plan view.

A capacitor structure CS may be disposed on the landing pad LP. The capacitor structure CS may include a lower electrode LE, a dielectric layer DL, and an upper electrode UE, and a support SUP may be further disposed on a sidewall of the lower electrode LE.

According to example embodiments of the present disclosure, the first gate electrode 330A1 may correspond to the first sub-word line WLX (see FIG. 3), and the second gate electrode 330A2 may correspond to the second sub-word line WLY (see FIG. 3). When a memory cell is selected, the boosted voltage VPP may be applied to the first gate electrode 330A1 and the second gate electrode 330A2, and when the memory cell is not selected, the negative voltage VBB2 may be applied to the first gate electrode 330A1 and the buffer voltage VPT may be applied to the second gate electrode 330A2. Accordingly, the integrated circuit device 300 may have a reduced off current, and a GIDL current may be significantly reduced.

Figure 22:
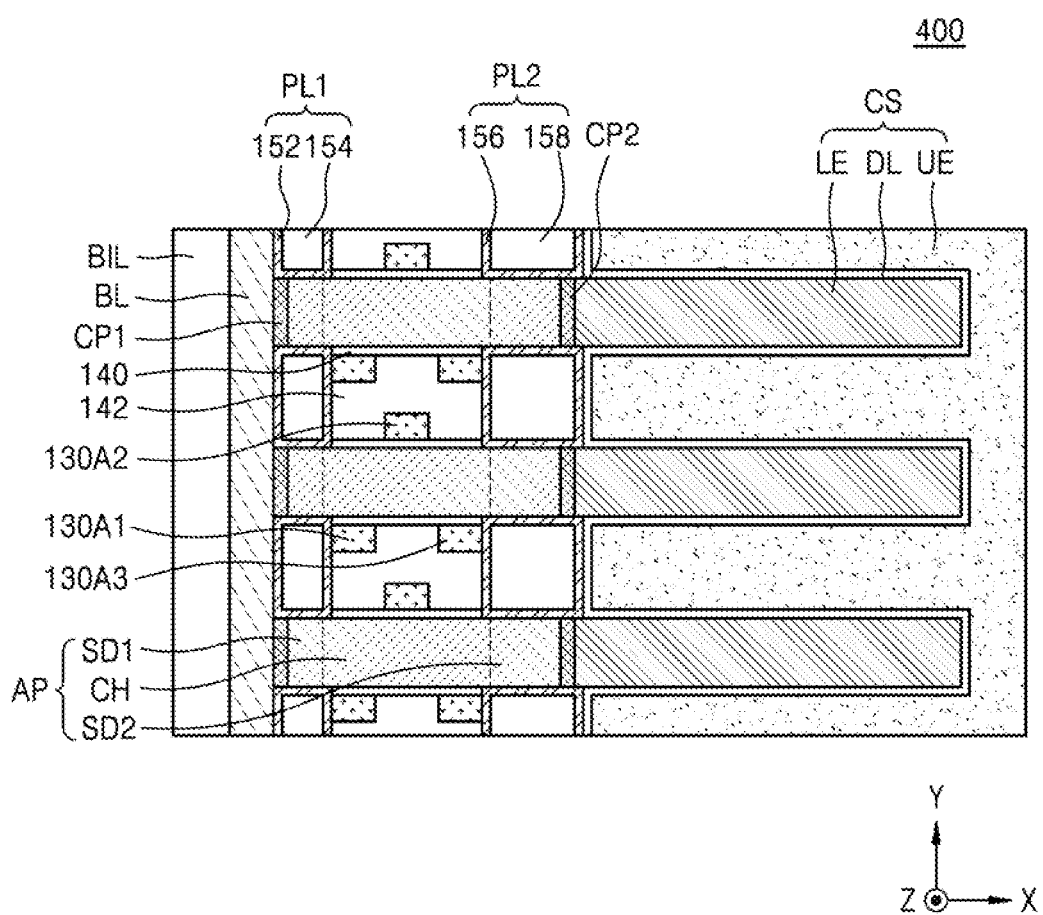
FIG. 22 is a plan view illustrating an integrated circuit device according to example embodiments of the present disclosure.
Figure 23:
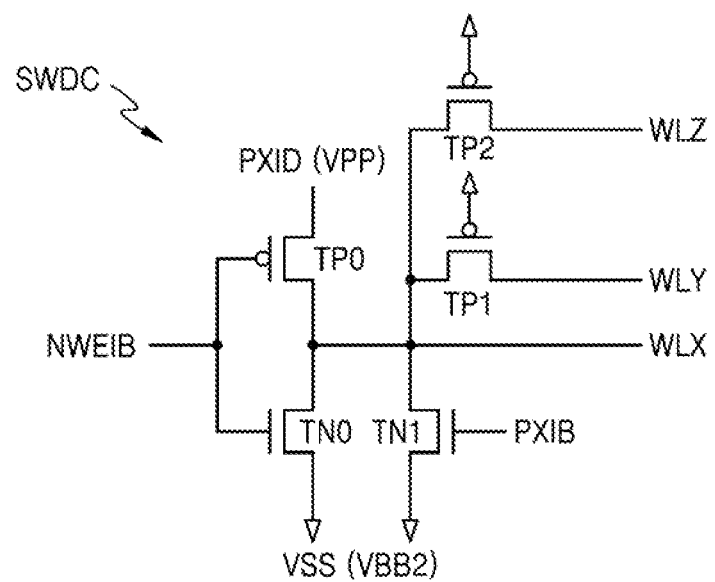
FIG. 23 is a circuit diagram of a word line driving circuit according to example embodiments of the present disclosure.

FIG. 22 is a plan view illustrating an integrated circuit device 400 according to example embodiments of the present disclosure, and FIG. 23 is a circuit diagram of a word line driving circuit SWDC according to example embodiments of the present disclosure.

Referring to FIGS. 22 and 23, a first gate electrode 130A1, a second gate electrode 130A2, and a third gate electrode 130A3 may be spaced apart from each other and sequentially disposed on the sidewall of a semiconductor pattern AP. For example, the first gate electrode 130A1 may be disposed in an area adjacent to a bit line BL on a first sidewall of the semiconductor pattern AP, the second gate electrode 130A1 may be disposed on a second sidewall of the semiconductor pattern AP, and the third gate electrode 130A3 may be disposed in an area adjacent to a capacitor structure CS on the first sidewall of the semiconductor pattern AP. The distance between the second gate electrode 130A2 and the bit line BL may be greater than the distance between the first gate electrode 130A1 and the bit line BL, and the distance between the third gate electrode 130A3 and the bit line BL may be greater than the distance between the second gate electrode 130A2 and the bit line BL.

In embodiments, the first gate electrode 130A1, the second gate electrode 130A2, and the third gate electrode 130A3 may be spaced apart from each other and disposed on the first sidewall of the semiconductor pattern AP. In embodiments, the first gate electrode 130A1 and the second gate electrode 130A2 may be spaced apart from each other on a first sidewall of the semiconductor pattern AP, the third gate electrode 130A3 may be disposed on a second sidewall of the semiconductor pattern AP, and the distance between the third gate electrode 130A3 and the bit line BL may be greater than the distance between the second gate electrode 130A2 and the bit line BL.

The first gate electrode 130A1, the second gate electrode 130A2, and the third gate electrode 130A3 may be referred to as a first sub-word line WLX, a second sub-word line WLY, and a third sub-word line WLZ, respectively.

The integrated circuit device 400 according to example embodiments of the present disclosure may include a word line driving circuit SWDC as shown in FIG. 23. The word line driving circuit SWDC may include a PMOS transistor TP0, an NMOS transistor TN0, a keeping NMOS transistor TN1, a first keeping PMOS transistor TP1, and a second keeping PMOS transistor TP2.

A first word line driving signal PXID is applied to the source of the PMOS transistor TP0, a sub-word line enable signal NWEIB is applied to the gate of the PMOS transistor TP0, and the first sub-word line WLX is connected to the drain of the PMOS transistor TP0. A negative voltage VBB2 is applied to the source of the NMOS transistor TN0, the sub-word line enable signal NWEIB is applied to the gate of the NMOS transistor TN0, and the first sub-word line WLX is connected to the drain of the NMOS transistor TN0.

A second word line driving signal PXIB is applied to the gate of the keeping NMOS transistor TN1, the negative voltage VBB2 is applied to the source of the keeping NMOS transistor TN1, and the first sub-word line WLX is connected to the drain of the keeping NMOS transistor TN1. The first sub-word line WLX is connected to the source of the first keeping PMOS transistor TP1, the second sub-word line WLY is connected to the drain of the first keeping PMOS transistor TP1, and a negative voltage may be applied to the gate of the first keeping PMOS transistor TP1. The first sub-word line WLX is connected to the source of the second keeping PMOS transistor TP2, the third sub-word line WLZ is connected to the drain of the second keeping PMOS transistor TP2, and a negative voltage may be applied to the gate of the second keeping PMOS transistor TP2.

Figure 24:
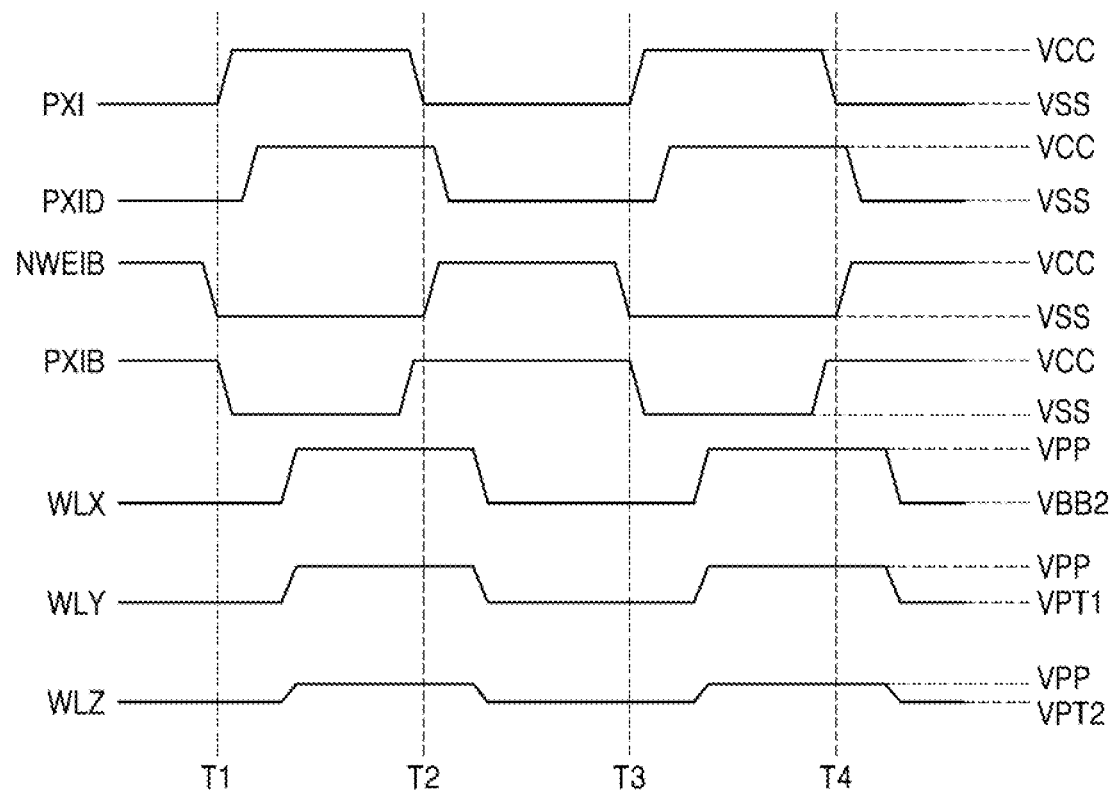
FIG. 24 is a timing diagram illustrating driving of a word line driving circuit according to example embodiments of the present disclosure.

FIG. 24 is a timing diagram illustrating driving of a word line driving circuit according to example embodiments of the present disclosure.

Referring to FIG. 24, the first word line enable signal PXI initially maintains a low level, transitions to a high level VCC at timings T1 and T3 if it is desired to activate corresponding first to third sub-word lines WLX, WLY, and WLZ, and transitions to a low level VSS at timings T2 and T4 if it is desired to activate the other word lines.

The first word line driving signal PXID initially maintains a low level, transitions to the level of the boosted voltage VPP when the first word line enable signal PXI transitions to the high level VCC at timings T1 and T3, and transitions to the level of a ground voltage, for example, the low level VSS, when the first word line enable signal PXI transitions to the low level VSS at timings T2 and T4.

The sub-word line enable signal NWEIB initially maintains the high level VCC and disables the corresponding first to third sub-word lines WLX, WLY, and WLZ to a negative voltage level. Then, the sub-word line enable signal NWEIB transitions to the low level VSS at timings T1 and T3 if it is desired to activate the corresponding first to third sub-word lines WLX, WLY, and WLZ, and transitions to the high level VCC at timings T2 and T4 if it is desired to activate the other word lines.

The second word line driving signal PXIB initially maintains the high level VCC and disables the corresponding first to third sub-word lines WLX, WLY, and WLZ to a negative voltage level. Then, the second word line driving signal PXIB transitions to the low level VSS at timings T1 and T3 if it is desired to activate the corresponding first to third sub-word lines WLX, WLY, and WLZ, and transitions to the high level VCC at timings T2 and T4 if it is desired to activate the other word lines.

The first sub-word line WLX is initially maintained at a negative level in response to the second word line driving signal PXIB. Then, when the sub-word line enable signal NWEIB transitions to the low level VSS at timings T1 and T3, the first word line driving signal PXID is transmitted to the first sub-word line WLX after a certain time delay has elapsed, and when the sub-word line enable signal NWEIB transitions to the high level VCC at timings T2 and T4 at which the other word lines are activated, the first sub-word line WLX is deactivated to the level of the negative voltage VBB2 in response to the second word line driving signal PXIB.

The second sub-word line WLY is initially maintained at the level of the buffer voltage VPT in response to the second word line driving signal PXIB. Then, when the sub-word line enable signal NWEIB transitions to the low level VSS at timings T1 and T3, the first word line driving signal PXID is transmitted to the second sub-word line WLY after a certain time delay has elapsed, and when the sub-word line enable signal NWEIB transitions to the high level VCC at timings T2 and T4 at which the other word lines are activated, the second sub-word line WLY is deactivated to the level of a first buffer voltage VPT1 in response to the second word line driving signal PXIB.

The third sub-word line WLZ is initially maintained at the level of the buffer voltage VPT in response to the second word line driving signal PXIB. Then, when the sub-word line enable signal NWEIB transitions to the low level VSS at timings T1 and T3, the first word line driving signal PXID is transmitted to the third sub-word line WLZ after a certain time delay has elapsed, and when the sub-word line enable signal NWEIB transitions to the high level VCC at timings T2 and T4 at which the other word lines are activated, the third sub-word line WLZ is deactivated to the level of a second buffer voltage VPT2 in response to the second word line driving signal PXIB.

In example embodiments of the present disclosure, the level of the first buffer voltage VPT1 may be lower than the level of the boosted voltage VPP and higher than the level of the negative voltage VBB2, and level of the second buffer voltage VPT2 may be lower than the level of the boosted voltage VPP and higher than the level of the first buffer voltage VPT1. For example, the level of the first buffer voltage VPT1 may be about 0.1 V to about 0.5 V, and the level of the second buffer voltage VPT2 may be about 0.2 V to about 0.8 V. The difference between the level of the first buffer voltage VPT1 and the level of the negative voltage VBB2 may correspond to the threshold voltage level of the first keeping PMOS transistor TP1, and the difference between the level of the second buffer voltage VPT2 and the negative voltage VBB2 may correspond to the threshold voltage level of the second keeping PMOS transistor TP2.

Referring back to FIG. 22, when a memory cell MC is selected (or when a memory cell transistor MCT is turned on), the boosted voltage VPP may be applied to the first to third gate electrodes 130A1, 130A2, and 130A3, and when the memory cell MC is unselected (or when the memory cell transistor MCT is turned off), the negative voltage VBB2 may be applied to the first gate electrode 130A1, the first buffer voltage VPT1 may be applied to the second gate electrode 130A2, and the second buffer voltage VPT2 may be applied to the third gate electrode 130A3.

According to example embodiments of the present disclosure, an abrupt field may be prevented from being formed in the channel region CH adjacent to the second source/drain region SD2, and accordingly, the integrated circuit device 400 may have a reduced off current and a GIDL current may be significantly reduced.

The structure of a memory cell transistor MCT including the first to third sub-word lines WLX, WLY, and WLZ connected to the first to third gate electrodes 130A1, 130A2, and 130A3, and a word line driving circuit SWDC for the memory cell transistor MCT has been described as an example with reference to FIGS. 22 to 24. However, unlike in FIGS. 22 to 24, in some embodiments, an additional gate electrode sharing one channel region CH may be formed. In this case, the word line driving circuit SWDC may further include an additional keeping PMOS transistor, the first sub-word line WLX may be connected to the source of the additional keeping PMOS transistor, an additional sub-word line may be connected to the drain of the additional keeping PMOS transistor, and a negative voltage may be applied to the gate of the additional keeping PMOS transistor.

While the inventive concept has been particularly shown and described with reference to embodiments thereof, it will be understood that various changes in form and details may be made therein without departing from the spirit and scope of the present disclosure.

What is claimed is:
1. An integrated circuit device, comprising:
a plurality of memory cells arranged on a substrate, each of the plurality of memory cells including:
a semiconductor pattern extending in a first horizontal direction that is parallel to a top surface of the substrate and including a first source/drain region, a channel region, and a second source/drain region;
a bit line disposed adjacent to the first source/drain region of the semiconductor pattern and extending in a second horizontal direction that is parallel to the top surface of the substrate;
a first sub-word line disposed adjacent to the channel region of the semiconductor pattern, spaced apart from the bit line by a first distance, and extending in a vertical direction that is perpendicular to the top surface of the substrate;
a second sub-word line disposed adjacent to the channel region of the semiconductor pattern, spaced apart from the bit line by a second distance that is greater than the first distance, and extending in the vertical direction, the second sub-word line being spaced apart from the first sub-word line; and
a capacitor structure disposed adjacent to the second source/drain region of the semiconductor pattern.
2. The integrated circuit device of claim 1, wherein the semiconductor pattern includes a first sidewall and a second sidewall opposite to the first sidewall,
wherein the first sub-word line is disposed on the first sidewall, and
wherein the second sub-word line is disposed on the second sidewall.

3. The integrated circuit device of claim 1, wherein the capacitor structure has a cylindrical shape extending in the second direction.

4. The integrated circuit device of claim 1, wherein semiconductor pattern includes a first sidewall and a second sidewall opposite to the first sidewall,
wherein the first sub-word line is disposed on the first sidewall and the second sidewall, and
wherein the second sub-word line is disposed on the first sidewall and the second sidewall.

5. The integrated circuit device of claim 1, further comprising:
a word line driving circuit configured to drive the first sub-word line and the second sub-word line of each of the plurality of memory cells,
wherein the word line driving circuit includes:
a P-channel metal oxide semiconductor (PMOS) transistor, wherein a first word line driving signal is applied to a source of the PMOS transistor, a sub-word line enable signal is applied to a gate of the PMOS transistor, and the first sub-word line is connected to a drain of the PMOS transistor;
an N-channel metal oxide semiconductor (NMOS) transistor, wherein a negative voltage is applied to a source of the NMOS transistor, the sub-word line enable signal is applied to a gate of the NMOS transistor, and the first sub-word line is connected to a drain of the NMOS transistor;
a keeping NMOS transistor, wherein a second word line driving signal is applied to a gate of the keeping NMOS transistor, the negative voltage is applied to a source of the keeping NMOS transistor, and the first sub-word line is connected to a drain of the keeping NMOS transistor; and
a first keeping PMOS transistor, wherein the first sub-word line is connected to a source of the first keeping PMOS transistor, the second sub-word line is connected to a drain of the first keeping PMOS transistor, and a negative voltage is applied to a gate of the first keeping PMOS transistor.

6. The integrated circuit device of claim 5, wherein the word line driving circuit is further configured to:
apply a first voltage to the first sub-word line and the second sub-word line of a selected memory cell,
apply a second voltage to the first sub-word line of an unselected memory cell, and apply a third voltage to the second sub-word line of the unselected memory cell in response to the sub-word line enable signal, the first word line driving signal, and the second word line driving signal,
wherein the first voltage is set to a boosted voltage that is higher than a power supply voltage, the second voltage is set to a negative voltage that is lower than a ground voltage, and the third voltage is set to a buffer voltage that is higher than the ground voltage and lower than the power supply voltage.

7. The integrated circuit device of claim 6, wherein the buffer voltage is in a range of about 0.1 Volts to about 0.5 Volts,
wherein a difference between the buffer voltage and the negative voltage corresponds to a threshold voltage of the first keeping PMOS transistor.

8. The integrated circuit device of claim 6, wherein each of the plurality of memory cells further includes:
a third sub-word line disposed adjacent to the channel region of the semiconductor pattern, spaced apart from the bit line by a third distance that is greater than the second distance, and extends in the vertical direction.

9. The integrated circuit device of claim 8, wherein the word line driving circuit is further configured apply the first voltage to the third sub-word line connected to the selected memory cell and apply a fourth voltage to the third sub-word line of the unselected memory cell,
wherein the fourth voltage is higher than the third voltage and is lower than the power supply voltage.

10. The integrated circuit device of claim 9, wherein the word line driving circuit further includes:
a second keeping PMOS transistor, wherein the first sub-word line is connected to a source of the second keeping PMOS transistor, the third sub-word line is connected to a drain of the second keeping PMOS transistor, and a negative voltage is applied to a gate of the second keeping PMOS transistor.

11. An integrated circuit device, comprising:
a plurality of memory cells arranged on a substrate, each of the plurality of memory cells including:
a semiconductor pattern extending in a first horizontal direction that is parallel to a top surface of the substrate and including a first source/drain region, a channel region, and a second source/drain region;
a bit line disposed adjacent to the first source/drain region of the semiconductor pattern and extending in a second horizontal direction that is parallel to the top surface of the substrate;
a first sub-word line disposed adjacent to the channel region of the semiconductor pattern, spaced apart from the bit line by a first distance, and extending in a vertical direction that is perpendicular to the top surface of the substrate;
a second sub-word line disposed adjacent to the channel region of the semiconductor pattern, spaced apart from the bit line by a second distance that is greater than the first distance, and extending in the vertical direction, the second sub-word line being spaced apart from the first sub-word line; and
a capacitor structure disposed adjacent to the second source/drain region of the semiconductor pattern,
wherein the integrated circuit device is configured such that a first word line voltage is applied to the first sub-word line and a second word line voltage is applied to the second sub-word line, and the second word line voltage is different from the first word line voltage.

12. The integrated circuit device of claim 11, wherein the semiconductor pattern includes a first sidewall and a second sidewall opposite to the first sidewall,
wherein the first sub-word line is disposed on the first sidewall, and
wherein the second sub-word line is disposed on the second sidewall.

13. The integrated circuit device of claim 11, wherein the capacitor structure has a cylindrical shape extending in the second direction.

14. The integrated circuit device of claim 11, wherein semiconductor pattern includes a first sidewall and a second sidewall opposite to the first sidewall,
wherein the first sub-word line is disposed on the first sidewall and the second sidewall, and
wherein the second sub-word line is disposed on the first sidewall and the second sidewall.

15. The integrated circuit device of claim 11, further comprising:
- a word line driving circuit configured to drive the first sub-word line and the second sub-word line of each of the plurality of memory cells,
- wherein the word line driving circuit includes:
- a P-channel metal oxide semiconductor (PMOS) transistor, wherein a first word line driving signal is applied to a source of the PMOS transistor, a sub-word line enable signal is applied to a gate of the PMOS transistor, and the first sub-word line is connected to a drain of the PMOS transistor;
- an N-channel metal oxide semiconductor (NMOS) transistor, wherein a negative voltage is applied to a source of the NMOS transistor, the sub-word line enable signal is applied to a gate of the NMOS transistor, and the first sub-word line is connected to a drain of the NMOS transistor;
- a keeping NMOS transistor, wherein a second word line driving signal is applied to a gate of the keeping NMOS transistor, the negative voltage is applied to a source of the keeping NMOS transistor, and the first sub-word line is connected to a drain of the keeping NMOS transistor; and
- a first keeping PMOS transistor, wherein the first sub-word line is connected to a source of the first keeping PMOS transistor, the second sub-word line is connected to a drain of the first keeping PMOS transistor, and a negative voltage is applied to a gate of the first keeping PMOS transistor.

16. The integrated circuit device of claim 15, wherein the word line driving circuit is further configured to:
- apply a first voltage to the first sub-word line and the second sub-word line of a selected memory cell,
- apply a second voltage to the first sub-word line of an unselected memory cell, and apply a third voltage to the second sub-word line of the unselected memory cell in response to the sub-word line enable signal, the first word line driving signal, and the second word line driving signal,
- wherein the first voltage is set to a boosted voltage that is higher than a power supply voltage, the second voltage is set to a negative voltage that is lower than a ground voltage, and the third voltage is set to a buffer voltage that is higher than the ground voltage and lower than the power supply voltage.

17. The integrated circuit device of claim 16, wherein the buffer voltage is in a range of about 0.1 Volts to about 0.5 Volts,
- wherein a difference between the buffer voltage and the negative voltage corresponds to a threshold voltage of the first keeping PMOS transistor.

18. An integrated circuit device, comprising:
- a plurality of memory cells arranged on a substrate, each of the plurality of memory cells including:
- a semiconductor pattern extending in a first horizontal direction that is parallel to a top surface of the substrate and including a first source/drain region, a channel region, and a second source/drain region;
- a bit line disposed adjacent to the first source/drain region of the semiconductor pattern and extending in a second horizontal direction that is parallel to the top surface of the substrate;
- a first sub-word line disposed adjacent to the channel region of the semiconductor pattern, spaced apart from the bit line by a first distance, and extending in a vertical direction that is perpendicular to the top surface of the substrate;
- a second sub-word line disposed adjacent to the channel region of the semiconductor pattern, spaced apart from the bit line by a second distance that is greater than the first distance, and extending in the vertical direction, the second sub-word line being spaced apart from the first sub-word line;
- a third sub-word line disposed adjacent to the channel region of the semiconductor pattern, spaced apart from the bit line by a third distance that is greater than the second distance, and extends in the vertical direction; and
- a capacitor structure disposed adjacent to the second source/drain region of the semiconductor pattern.

19. The integrated circuit device of claim 18, further comprising:
- a word line driving circuit configured to apply a first voltage to the first sub-word line, the second sub-word line, and the third sub-word line, each of the first to third sub-word lines being connected to a selected memory cell, apply a second voltage to the first sub-word line of an unselected memory cell, apply a third voltage to the second sub-word line of the unselected memory cell, and apply a fourth voltage to the third sub-word line of the unselected memory cell, in response to a sub-word line enable signal, a first word line driving signal, a second word line driving signal, and a third word line driving signal.

20. The integrated circuit device of claim 19, wherein the first voltage is set to a boosted voltage that is higher than a power supply voltage, the second voltage is set to a negative voltage that is lower than a ground voltage, the third voltage is set to a buffer voltage that is higher than the ground voltage and lower than the power supply voltage, and the fourth voltage is higher than the third voltage and lower than the power supply voltage.

* * * * *